US011901011B2

(12) United States Patent
Ikegami et al.

(10) Patent No.: US 11,901,011 B2
(45) Date of Patent: Feb. 13, 2024

(54) SEMICONDUCTOR STORAGE DEVICE HAVING REDUCED THRESHOLD DISTRIBUTION INTERFERENCE

(71) Applicant: Kioxia Corporation, Tokyo (JP)

(72) Inventors: Kazutaka Ikegami, Inagi (JP); Hidehiro Shiga, Yokohama (JP)

(73) Assignee: Kioxia Corporation, Tokyo (JP)

( * ) Notice: Subject to any disclaimer, the term of this patent is extended or adjusted under 35 U.S.C. 154(b) by 198 days.

(21) Appl. No.: 17/399,548

(22) Filed: Aug. 11, 2021

(65) Prior Publication Data

US 2022/0189556 A1    Jun. 16, 2022

(30) Foreign Application Priority Data

Dec. 16, 2020   (JP) ................. 2020-208721

(51) Int. Cl.
| | |
|---|---|
| *G11C 16/04* | (2006.01) |
| *G11C 16/10* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC .......... *G11C 16/10* (2013.01); *G11C 16/0483* (2013.01); *H10B 41/10* (2023.02); *H10B 41/27* (2023.02); *H10B 43/10* (2023.02); *H10B 43/27* (2023.02)

(58) Field of Classification Search
CPC ..... G11C 16/10; G11C 16/0483; G11C 16/08; H10B 41/10; H10B 41/27; H10B 43/10; H10B 43/27; H01L 29/40114; H01L 29/40117

USPC ..................................... 365/185.18
See application file for complete search history.

(56) References Cited

U.S. PATENT DOCUMENTS

| | | | |
|---|---|---|---|
| 10,269,828 B2 * | 4/2019 | Futatsuyama | G11C 16/26 |
| 2017/0271021 A1 | 9/2017 | Futatsuyama et al. | |
| 2018/0277565 A1 * | 9/2018 | Futatsuyama | G11C 16/10 |

FOREIGN PATENT DOCUMENTS

| | | |
|---|---|---|
| JP | 2017-168163 A | 9/2017 |
| JP | 2018-164070 A | 10/2018 |

* cited by examiner

*Primary Examiner* — Tha-O H Bui
(74) *Attorney, Agent, or Firm* — Oblon, McClelland, Maier & Neustadt, L.L.P.

(57) ABSTRACT

A semiconductor storage device includes a first word line, a second word line provided in the same layer with the first word line and configured to be controlled independently from the first word line, a plurality of memory pillars between the first word line and the second word line, each of the plurality of memory pillars including a first memory cell facing to the first word line and a second memory cell facing to the second word line, the plurality of memory pillars being arranged in a first direction and a second direction intersecting to the first direction and a control circuit. The control circuit is configured to perform a write operation to the second memory cell included in the plurality of memory pillars after performing a write operation to the first memory cell included in each of the plurality of memory pillars.

11 Claims, 28 Drawing Sheets

|  |  | SDG0 | SDG1 | SDG2 | SDG3 |
|---|---|---|---|---|---|
|  |  | ⋮ | ⋮ | ⋮ | ⋮ |
| WLo2 | 2nd stage |  |  |  |  |
|  | 1st stage |  | 15 |  | 16 |
| WLe2 | 2nd stage |  |  |  |  |
|  | 1st stage | 13 |  | 14 |  |
| WLo1 | 2nd stage |  | 19 |  | 20 |
|  | 1st stage |  | 7 |  | 8 |
| WLe1 | 2nd stage | 17 |  | 18 |  |
|  | 1st stage | 5 |  | 6 |  |
| WLo0 | 2nd stage |  | 11 |  | 12 |
|  | 1st stage |  | 3 |  | 4 |
| WLe0 | 2nd stage | 9 |  | 10 |  |
|  | 1st stage | 1 |  | 2 |  |

FIG. 22

SEMICONDUCTOR STORAGE DEVICE HAVING REDUCED THRESHOLD DISTRIBUTION INTERFERENCE

CROSS REFERENCE TO RELATED APPLICATIONS

This application is based upon and claims the benefit of priority from the prior Japanese Patent Application No. 2020-208721 filed on Dec. 16, 2020, the entire contents of which are incorporated herein by reference.

FIELD

Embodiments of the present disclosures relate to a semiconductor storage device.

BACKGROUND

A memory system, which includes a NAND-type flash memory as a semiconductor storage device and a controller, which controls the NAND-type flash memory, is known.

BRIEF DESCRIPTION OF DRAWINGS

FIG. 22 is a diagram illustrating a write operation of multiple stages in a semiconductor storage device according to an embodiment;

DETAILED DESCRIPTION

Figure 1:
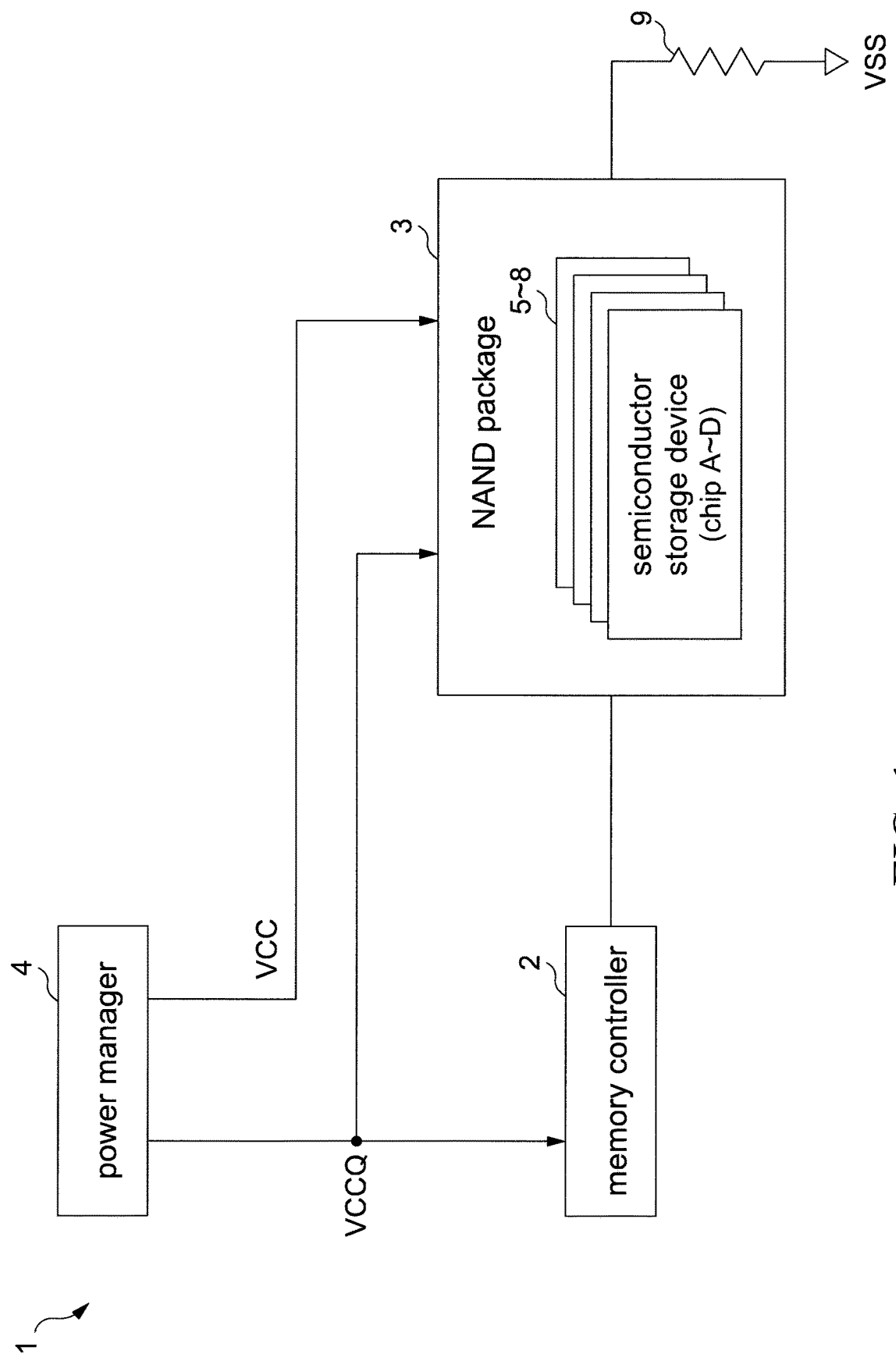
FIG. 1 is a block diagram illustrating a power supply system of a memory system according to an embodiment.

The problem to be solved by an embodiment is to shorten time of the write operation of a semiconductor storage device.

A semiconductor storage device according to an embodiment includes a first word line, a second word line provided in the same layer with the first word line and configured to be controlled independently from the first word line, a plurality of memory pillars between the first word line and the second word line, each of the plurality of memory pillars including a first memory cell facing to the first word line and a second memory cell facing to the second word line, the plurality of memory pillars being arranged in a first direction and a second direction intersecting to the first direction and a control circuit configured to operate a write operation to the second memory cell included in the plurality of memory pillars after operating a write operation to the first memory cell included in each of the plurality of memory pillars.

Hereinafter, a non-volatile semiconductor storage device according to the present embodiments are described in detail by referring to the drawings. In the following description, elements having substantially the same functions and configurations are denoted by the same reference numerals and are described redundantly only when necessary. Each of the embodiments described below exemplifies a device and a method for embodying the technical idea of this embodiment. The technical idea of the embodiment is not limited as the material, shape, structure, arrangement and the like of the constituent parts described below. Various modifications may be made to the technical idea of the embodiment in addition to the scope of the claims.

Further, in the following description, signals X<n:0> ("n" is a natural number) are made up of (n+1)-bit signals, and mean a group of signals X<0>, X<1>, ..., and X<n>, each of which is a 1-bit signal. In addition, elements Y<n:0> mean a group of elements Y<0>, Y<1>, and Y<n>, which correspond to the input or output of the signals X<n:0> in a one-to-one relationship.

In the following description, a signal BZ indicates that it is an inverted signal of a signal Z. Alternatively, when the signal Z is a control signal, the signal Z is a positive logic and the signal BZ is a negative logic. That is, the "H" level of the signal Z corresponds to assertion, and the "L" level of the signal Z corresponds to negation. The "L" level of the signal BZ corresponds to assertion, and the "H" level of the signal Z corresponds to negation.

In the following description, the notation A/B means A or B. For example, "X includes A/B, C/D and E" includes the case "X includes A, C and E" and "X includes B, D and E".

A memory system according to a first embodiment is described with reference to the FIGS. 1 to 21. The memory system according to the first embodiment includes, for example, a NAND-type flash memory as a semiconductor storage device and memory controller which controls the NAND-type flash memory.

The overall configuration of the memory system according to the first embodiment is described with reference to FIGS. 1 and 2. The memory system 1 communicates with, for example, an external host device (not illustrated). The memory system 1 holds data received from the host device and transmits data which is read from the semiconductor storage devices 5 to 8 to the host device.

FIG. 1 is a diagram for explaining a power supply system of the memory system according to the first embodiment. As shown in FIG. 1, the memory system 1 includes a memory controller 2, a NAND package 3, a power manager 4 and a reference resistance 9. The NAND package 3 includes, for example, a plurality of semiconductor storage devices 5 to 8. In FIG. 1, four chips are included in the NAND package 3. In the following discussion, the semiconductor storage devices 5 to 8 may be read as chips A to D, respectively.

The power manager 4 is an integrated circuit (IC) for managing the voltage to be supplied to the memory controller 2 and the NAND package 3. The power manager 4 supplies, for example, a voltage VCCQ to the memory controller 2 and the NAND package 3. The voltage VCCQ is used as a reference of the voltage that is used for an input/output signal between the memory controller 2 and the NAND package 3. In addition, the power manager 4 supplies, for example, a voltage VCC to the NAND package 3. The voltage VCC is used as a reference voltage of other voltages used in the NAND package 3.

In addition, the NAND package 3 is connected to a voltage VSS via the reference resistor 9. The reference resistor 9 is used, for example, to calibrate an output impedance of each of the semiconductor storage devices 5 to 8 in the NAND package 3. The voltage VSS is a ground voltage, and is defined as, for example, ground (0V) in the memory system 1.

Figure 2:
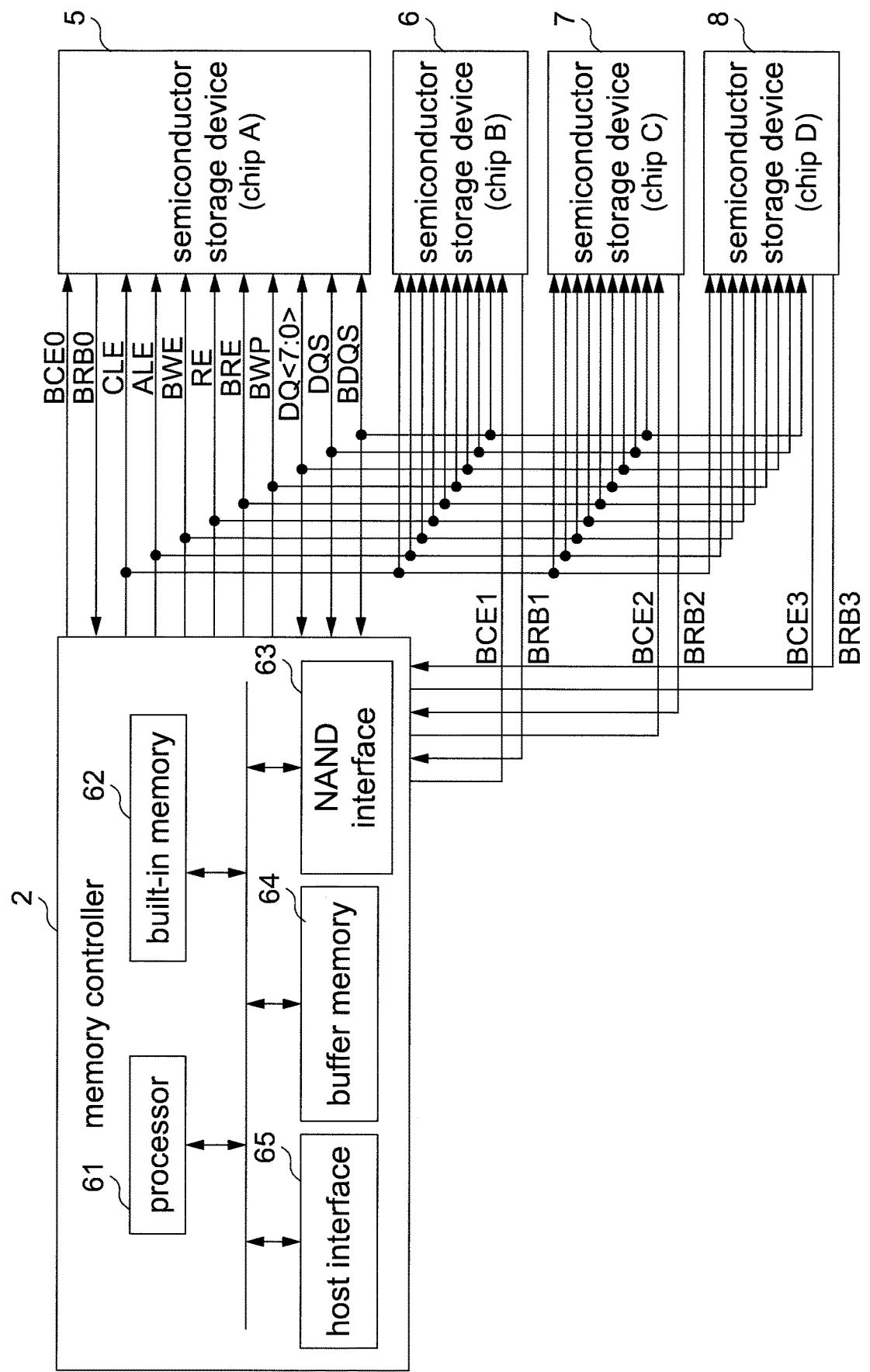
FIG. 2 is a block diagram illustrating a signal system of a memory system according to an embodiment.

FIG. 2 is a block diagram for explaining a configuration of a signal system of a memory system according to an embodiment. As shown in FIG. 2, the memory controller 2 controls the semiconductor storage devices 5 to 8. Specifically, the memory controller 2 writes data to the semiconductor storage devices 5 to 8 and reads data from the semiconductor storage devices 5 to 8. The memory controller 2 is connected to the semiconductor storage devices 5 to 8 by a NAND bus.

Each of the semiconductor storage devices 5 to 8 includes a plurality of memory cells and stores data in a non-volatile manner. Each the semiconductor storage devices 5 to 8 is a semiconductor chip that can be uniquely identified, for example, by being supplied with an individual chip enable signal or by being pre-assigned with an individual chip address. Therefore, each of the semiconductor storage devices 5 to 8 can be operated independently according to instructions of the memory controller 2.

Similar signals are transmitted and received on the NAND bus connected to each of the semiconductor storage devices 5 to 8. The NAND bus includes a plurality of signal lines to transmit and receive signals according to a NAND interface. BCE is a chip enable signal and operates with negative logic. BRB is a ready busy signal and operates in negative logic. CLE is a command latch enable signal and operates in positive logic. ALE is an address latch enable signal and operates in positive logic. BWE is a write enable signal and operates in negative logic. RE and BRE are read enable signals and inverted signals of them. The RE operates in positive logic. The BRE operates in negative logic. For example, the RE and/or BRE function as output instruction signals. BWP is a write protect signal and operates in negative logic.

DQ<7:0> is a data signal. The data signal DQ<7:0> is input and output via the input/output terminal (I/O port). Signals DQS and BDQS are a data strobe signal and an inverted signal of the data strobe signal. For example, the DQS and/or the BDQS function as the strobe signal or a timing control signal. The strobe signal (DQS/BDQS) is a signal pair having opposite phases. The strobe signal is a signal defining timing of transmitting and receiving the data signal DQ<7:0>. Signals BCE0 to BCE3 are transmitted from the memory controller 2 to each of the storage devices 5 to 8 independently. Signals BRB0 to BRB3 are transmitted independently from each of the semiconductor storage devices 5 to 8 to the memory controller 2. The signals CLE, ALE, BWE, RE, BRE and BWP are commonly transmitted from the memory controller 2 to the semiconductor storage devices 5 to 8.

The signals BCE0 to BCE3 are signals for enabling the semiconductor storage devices 5 to 8, respectively. The signal CLE notifies the semiconductor storage devices 5 to 8 that the data signals DQ<7:0> flowing to the semiconductor storage devices 5 to 8 are commands while the signal CLE is at the "high (H)" level. The signal ALE notifies the semiconductor storage devices 5 to 8 that the data signals DQ<7:0> flowing to the semiconductor storage devices 5 to 8 are addresses while the signal ALE is at the "H" level. The signal BWE instructs the semiconductor storage devices 5 to 8 to write the data signals DQ<7:0> flowing to the semiconductor storage devices 5 to 8 while the signal BWE is at the "low (L)" level.

The signals RE and BRE instruct the semiconductor storage devices 5 to 8 to output the data signals DQ<7:0>, and for example, are used to control the operation timing of the semiconductor storage devices 5 to 8 when outputting the data signals DQ<7:0>. The signal BWP instructs the semiconductor storage devices 5 to 8 to prohibit data writing and erasing. The signals BRB0 to BRB3 respectively indicate whether the semiconductor storage devices 5 to 8 are in a ready state (a state of accepting a command from the outside) or in a busy state (a state of not accepting a command from the outside).

The data signals DQ<7:0> are, for example, 8-bit signals. The data signals DQ<7:0> are transmitted and received between the semiconductor storage devices 5 to 8 and the memory controller 2, and include commands, addresses, and data. The signals DQS and BDQS may be generated, for example, based on the signals RE and BRE, and are used to control the operation timing of the semiconductor storage devices 5 to 8 in response to the data signals DQ<7:0>.

The memory controller 2 includes a processor (central processing unit (CPU)) 61, a built-in memory (random access memory (RAM)) 62, a NAND interface circuit 63, a buffer memory 64 and a host interface circuit 65.

The processor 61 controls the overall operation of the memory controller 2. The processor 61 issues, for example, a write command based on a NAND interface to the semiconductor storage devices 5 to 8 in response to a write command of data received from the outside. This function is equally applied to other operations such as, for example, read, erasing and calibration operations.

The built-in memory 62 is, for example, a semiconductor memory such as, for example, dynamic RAM (DRAM), and is used as a work area of the processor 61. The built-in memory 62 holds, for example, firmware and various management tables for managing the semiconductor storage devices 5 to 8.

The NAND interface circuit 63 is connected to the semiconductor storage devices 5 to 8 via the above-described NAND bus, and executes communication with the semiconductor storage devices 5 to 8. The NAND interface circuit 63 transmits commands, addresses, and write data to the semiconductor storage devices 5 to 8 in response to an instruction of the processor 61. In addition, the NAND interface circuit 63 receives statuses and read data from the semiconductor storage devices 5 to 8.

The buffer memory 64 temporarily holds, for example, data received by the memory controller 2 from the semiconductor storage devices 5 to 8 and the outside.

The host interface circuit 65 is connected to an external host device (not illustrated), and executes communication with the host device. The host interface circuit 65 transfers, for example, commands and data, received from the host device, to the processor 61 and the buffer memory 64, respectively.

[Configuration of the Semiconductor Storage Device]

The configuration of the semiconductor storage device according to the first embodiment is described with reference to FIG. 3. The semiconductor storage devices 5 to 8 have, for example, the same configuration. Therefore, in the following description, a configuration of the semiconductor storage device 5, among the semiconductor storage devices 5 to 8, is described, and a description related to a configuration of the semiconductor storage devices 6 to 8 is omitted.

Figure 3:
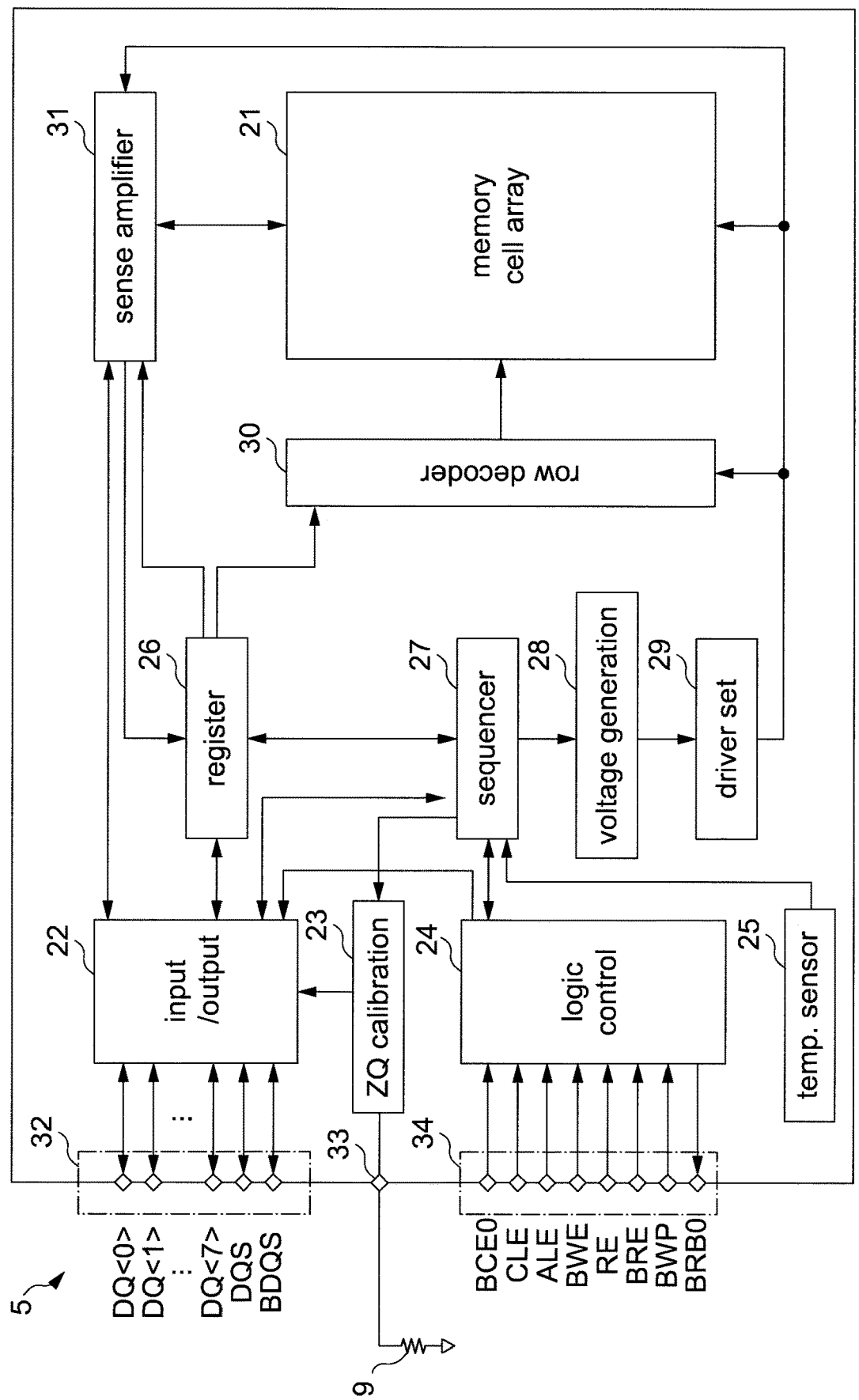
FIG. 3 is a block diagram illustrating a configuration of a semiconductor storage device according to an embodiment.

As illustrated in FIG. 3, the semiconductor storage device 5 includes a memory cell array 21, an input/output circuit 22, a ZQ calibration circuit 23, a logic control circuit 24, a temperature sensor 25 (temp. sensor), a register 26, a sequencer 27, a voltage generation circuit 28, a driver set 29, a row decoder 30, a sense amplifier 31, an input/output pad group 32, a ZQ calibration pad 33 and a logic-control pad group 34.

The memory cell array 21 includes a plurality of non-volatile memory cells (not illustrated) associated with word lines and bit lines.

The input/output circuit 22 transmits and receives the data signals DQ<7:0> to and from the memory controller 2. The input/output circuit 22 transfers commands and addresses in the data signals DQ<7:0> to the register 26. The input/output circuit 22 transmits and receives write data and read data to and from the sense amplifier 31.

The ZQ calibration circuit 23 calibrates the output impedance of the semiconductor storage device 5 based on the reference resistor 9 via the ZQ calibration pad 33.

The logic control circuit 24 receives the signals BCE0, CLE, ALE, BWE, RE, BRE and BWP from the memory controller 2. In addition, the logic control circuit 24 transfers the signal BRB0 to the memory controller 2 and notifies the state of the semiconductor storage device 5 to the outside.

The temperature sensor 25 measures the temperature inside the semiconductor storage device 5. The temperature sensor 25 sends information on the measured temperature to the sequencer 27. Further, the temperature sensor 25 may be provided at any position in the semiconductor storage device 5 in a range within which it may measure the temperature that may be regarded as the temperature of the memory cell array 21.

The register 26 holds commands and addresses. The register 26 transfers the addresses to the row decoder 30 and the sense amplifier 31, and transfers the commands to the sequencer 27.

The sequencer 27 receives the commands, and controls the entire semiconductor storage device 5 according to the sequence based on the received commands. In addition, the sequencer 27 sends information on the temperature, received from the temperature sensor 25, to the memory controller 2 via the input/output circuit 22.

The voltage generation circuit 28 generates voltages required for operations such as, for example, data writing, reading and erasing based on an instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the addresses from the register 26. The driver set 29 supplies various voltages to the row decoder 30 based on, for example, a row address among the addresses.

The row decoder 30 receives the row address, among the addresses, from the register 26, and selects the memory cells in the row based on the row address. Then, the voltages from the driver set 29 are transferred to the memory cells in the selected row via the row decoder 30.

At the time of reading data, the sense amplifier 31 senses read data that are read from the memory cells to the bit lines, and transfers the sensed read data to the input/output circuit 22. At the time of writing data, the sense amplifier 31 transfers write data via the bit lines to the memory cells. In addition, the sense amplifier 31 receives a column address, among the addresses, from the register 26, and outputs column data based on the column address.

The input/output pad group 32 transfers the data signal DQ<7:0>, the signal DQS and the signal BDQS, received from the memory controller 2, to the input/output circuit 22. In addition, the input/output pad group 32 transfers the data signal DQ<7:0>, transmitted from the input/output circuit 22, to the outside of the semiconductor storage device 5.

The ZQ calibration pad 33 is connected at one end thereof to the reference resistor 9 and at the other end thereof to the ZQ calibration circuit 23.

The logic control pad group 34 transfers signals BCE0, CLE, ALE, BWE, RE, BRE and BWP received from the memory controller 2 to the logic control circuit 24. The logic control pad group 34 transfers BRB0 transmitted from the logic control circuit 24 to the external of the semiconductor storage device 5.

[Configuration of Memory Cell Array 21]

Figure 4:
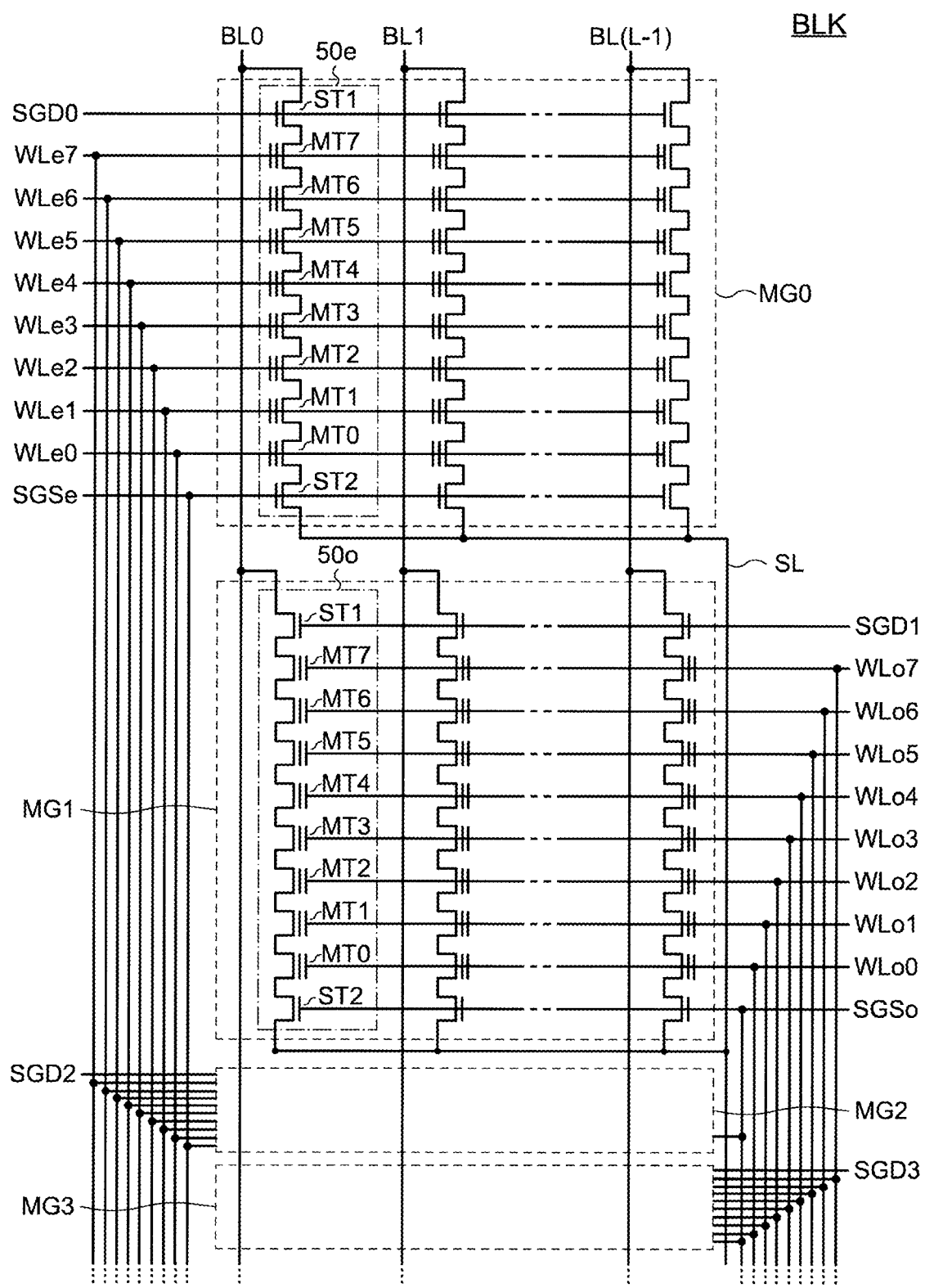
FIG. 4 is a diagram showing a circuit configuration of a memory cell array of a semiconductor storage device according to an embodiment.

The circuit configuration of the memory cell array 21 will be described with reference to FIG. 4. FIG. 4 is an equivalent circuit diagram of a block BLK. As shown in FIG. 4, the block BLK includes a plurality of memory groups MG (MG0, MG1, MG2, . . . ). Each memory group MG includes a plurality of NAND strings 50. In the following description, a NAND string of an even-numbered memory group MGe (MG0, MG2, MG4, . . . ) is referred to as a NAND string 50e. A NAND string of an odd-numbered memory group MGo (MG1, MG3, MG5, . . . ) is referred to as a NAND string 50o.

Each of the NAND strings 50 includes, for example, eight memory cell transistors MT (MT0 to MT7) and select transistors ST1 and ST2. The memory cell transistor MT includes a control gate and a charge storage layer. The memory cell transistor MT has a threshold voltage and is in an on-state when a voltage equal to or higher than the threshold voltage is applied to the control gate. When a write operation to the memory cell transistor MT is performed, the threshold voltage of the memory cell transistor MT varies. That is, the threshold voltage of the memory cell transistor MT varies when electrons are injected into the charge storage layer of the memory cell transistor MT. The threshold voltage of the memory cell transistor MT in a state where electrons are injected into the charge storage layer is higher than the threshold voltage of the memory cell transistor MT in a state where no electrons are injected into the charge storage layer. The memory cell transistor MT holds data non-volatile by variations of the threshold voltage due to the injection of electrons into the charge storage layer. The eight memory cell transistors MT are connected in series between a source of the select transistor ST1 and a drain of the select transistor ST2.

Gates of the select transistor ST1 in each of the memory groups MG are connected to select gate lines SGD (SGD0, SGD1, . . . ) respectively. Each select gate line SGD is independently controlled by the row decoder 30. Gate Gates of the select transistor ST2 in each of the even-numbered memory groups MGe (MG0, MG2, . . . ) are commonly connected to a select gate line SGSe. Gate of the select transistor ST2 in each of the odd-numbered memory groups MGo (MG1, MG3, . . . ) are commonly connected to a select gate line SGSo. The select gate lines SGSe and SGSo may be commonly connected or independently controllable.

The control gates of the memory cell transistors MT (MT0 to MT7) included in the memory group MGe in the same block BLK are commonly connected to word lines WLe (WLe0 to WLe7), respectively. On the other hand, the control gates of the memory cell transistors MT (MT0 to MT7) included in the memory group MGo are commonly connected to word lines WLo (WLo0 to WLo7), respectively. The word lines WLe and WLo are independently controlled by the row decoder 30.

The block BLK is, for example, an erasure unit of data. That is, data held by the memory cell transistors MT included in the same block BLK are collectively erased. The threshold voltage of the memory cell transistor MT in an erased state is lower than the threshold voltage of the memory cell transistor MT in a written state.

In the memory cell array 21, the drains of the select transistors ST1 included in the NAND strings 50 provided in the same column are commonly connected to a bit line BL (BL0 to BL(L−1)). L is a natural number of 2 or more. That is, the bit lines BL are commonly connected to the NAND strings 50 between the plurality of memory groups MG. In the memory cell array 21, the sources of the plurality of select transistors ST2 are commonly connected to a source line SL.

The memory group MG includes the plurality of NAND strings 50. The plurality of NAND strings 50 are connected to different bit lines BL and connected to the same select gate line SGD. The block BLK includes the plurality of memory groups MG sharing the word line WL. The memory cell array 21 includes a plurality of blocks BLK sharing the bit line BL. In the memory cell array 21, the select gate line SGS, the word line WL, and the select gate line SGD are stacked above a semiconductor substrate so that the memory cell transistor MT is stacked in three dimensions.

<Planar Layout of Memory Cell Array>

Figure 5:
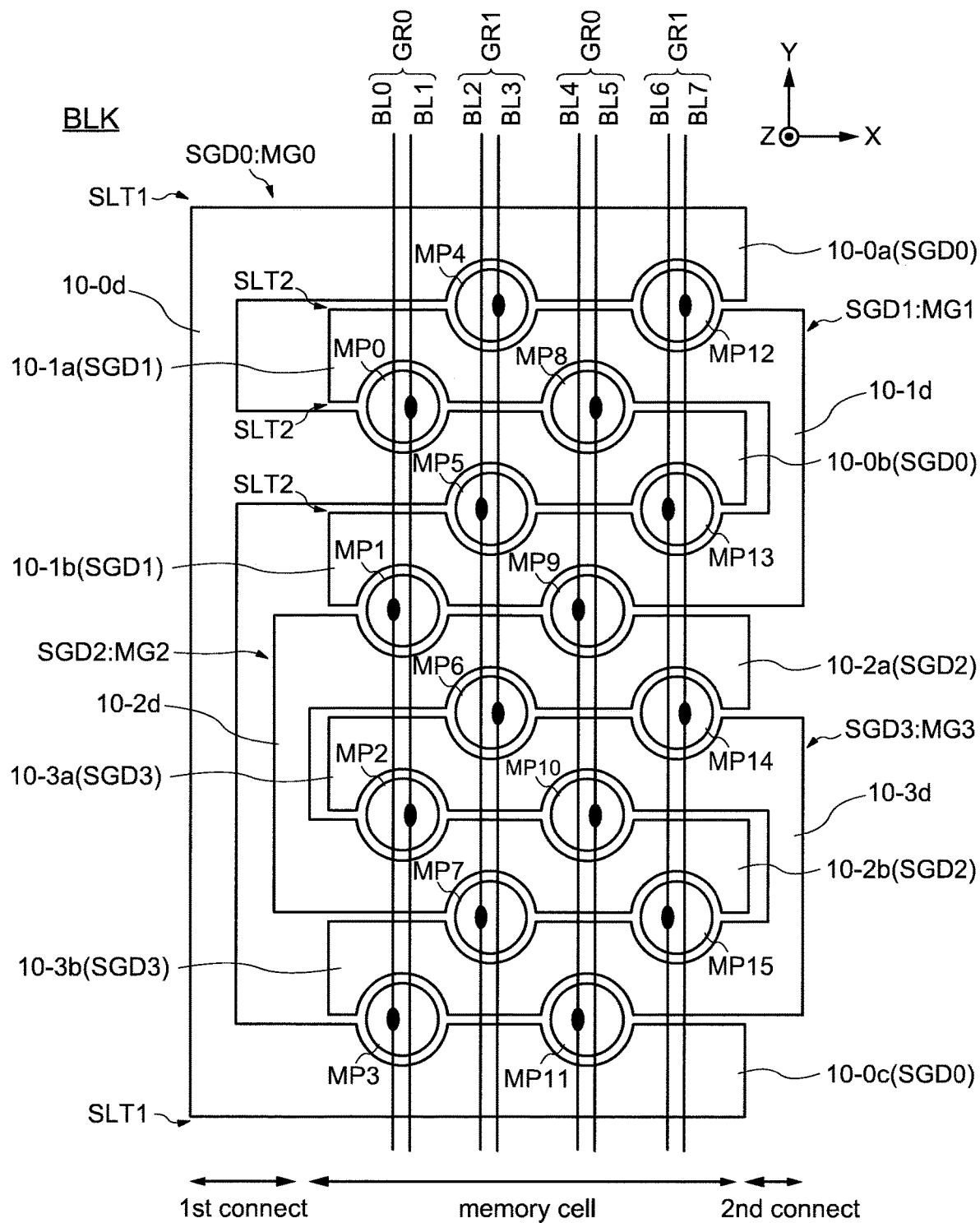
FIG. 5 is a diagram showing a layout of select gate lines, bit lines, and memory pillars of a semiconductor storage device according to an embodiment.

A planar configuration of the memory cell array 21 will be described with reference to FIG. 5. FIG. 5 shows a planar layout of the select gate line SGD in a semiconductor substrate plane (X-Y plane) of certain block BLK. In the present embodiment, a configuration in which four select gate lines SGD are included in one block BLK is described.

As shown in FIG. 5, wiring layers 10-0a, 10-0b, 10-0c having a longitudinal in the X-direction are connected by a first connecting section 10-0d (1st connect) having a longitudinal in the Y-direction. The two wiring layers 10-0a, 10-0c are provided at both ends in the Y-direction. The wiring layers 10-0a, 10-0b are adjacent to each other in the Y-direction with the other one wiring layer (a wiring layer 10-1a) interposed therebetween. The first connecting section 10-0d is provided at the first end in the X-direction. Three wiring layers 10-0a, 10-0b, 10-0c function as the select gate line SGD0.

The wiring layers 10-1a, 10-1b having the longitudinal in the X-direction are connected by a second connecting section 10-1d (2nd connect) having the longitudinal in the Y-direction. The wiring layer 10-1a is provided between the wiring layers 10-0a, 10-0b. The wiring layer 10-1b is provided between the wiring layer 10-0b and the other one wiring layer (a wiring layer 10-2a). The second connecting section 10-1d is provided on the second end which is the opposite side of the first connecting section 10-0d in the X-direction. The two wiring layers 10-1a, 10-1b function as the select gate line SGD1.

The wiring layers 10-2a, 10-2b having the longitudinal in the X-direction are connected by a first connecting section 10-2d having the longitudinal in the Y-direction. Similarly, wiring layers 10-3a, 10-3b having the longitudinal in the X-direction are connected by a second connecting section 10-3d having the longitudinal in the Y-direction. The wiring layer 10-2a is provided between the wiring layer 10-1b and the wiring layer 10-3a. The wiring layer 10-3a is provided between the wiring layer 10-2a and the wiring layer 10-2b. The wiring layer 10-2b is provided between the wiring layer 10-3a and the wiring layer 10-3b. The wiring layer 10-3b is provided between the wiring layer 10-2b and the wiring layer 10-0c. The first connecting section 10-2d is provided at a first end in the X-direction. The second connecting section 10-3d is provided at a second end in the X-direction. In the X-direction, the first end is an end portion on the same side as the first connect 10-0d, the second end is an end portion on the opposite side of the first connect 10-0d. The two wiring layers 10-2a, 10-2b function as the select gate line SGD2. The two wiring layers 10-3a, 10-3b function as the select gate line SGD3.

In the present embodiment, a configuration in which each wiring layer is connected by the first connecting sections 10-0d, 10-2d, or the second connecting sections 10-1d, 10-3d is exemplified but is not limited to this configuration.

For example, each wiring layer may be independent and controlled so that the same voltage is supplied to the wiring layers 10-0a, 10-0b, 10-0c, the same voltage is supplied to the wiring layers 10-1a, 10-1b, the same voltage is supplied to the wiring layers 10-2a, 10-2b, and the same voltage is supplied to the wiring layers 10-3a, 10-3b.

A group including a memory pillar MP adjacent to the wiring layers 10-0a, 10-0b, 10-0c is referred to as the memory group MG0. A group including the memory pillar MP adjacent to the wiring layers 10-1a, 10-1b is referred to as the memory group MG1. A group including the memory pillar MP adjacent to the wiring layers 10-2a, 10-2b is referred to as the memory group MG2. A group including the memory pillar MP adjacent to the wiring layers 10-3a, 10-3b is referred to as the memory group MG3.

The wiring layers 10 adjacent to each other in the Y-direction in the block BLK are insulated. An area that insulates the adjacent wiring layers 10 is referred to as a slit SLT2. In the slit SLT2, for example, an insulation layer is embedded in an area from a surface of the semiconductor substrate to a layer where at least the wiring layer 10 is provided. In the memory cell array 21, for example, the plurality of blocks BLK shown in FIG. 5 is arranged, in the Y-direction. Between the blocks BLK adjacent to each other in the Y-direction is also insulated in the same manner as described above. An area that insulates the adjacent blocks BLK is referred to as a slit SLT1. The slit SLT1 has the same configuration as the slit SLT2.

The plurality of memory pillars MP (MP0 to MP15) is provided between the wiring layers 10 adjacent to each other in the Y-direction. Each of the plurality of memory pillars MP has the longitudinal in the Z-direction. The Z-direction is a direction orthogonal (or intersecting) to the X-Y direction, i.e., a direction orthogonal to the surface of the semiconductor substrate. The plurality of memory pillars MP is provided in a memory cell section (memory cell).

Specifically, the memory pillars MP4, MP12 are provided between the wiring layers 10-0a, 10-1a. The memory pillars MP0, MP8 are provided between the wiring layers 10-1a, 10-0b. The memory pillars MP5, MP13 are provided between the wiring layers 10-0b, 10-1b. The memory pillars MP1, MP9 are provided between the wiring layers 10-1b, 10-2a. The memory pillars MP6, MP14 are provided between the wiring layers 10-2a, 10-3a. The memory pillars MP2, MP10 are provided between the wiring layers 10-3a, 10-2b. The memory pillars MP7, MP15 are provided between the wiring layers 10-2b, 10-3b. The memory pillars MP3, MP11 are provided between the wiring layers 10-3b, 10-0c.

The memory pillar MP is a structure body in which the select transistors ST1, ST2, and the memory cell transistor MT are formed. A detailed structure of the memory pillar MP will be described later.

The memory pillars MP0 to MP3 are arranged along the Y-direction. The memory pillars MP8 to MP11 are arranged along the Y-direction at positions adjacent to the memory pillars MP0 to MP3 in the X-direction. In other words, the memory pillars MP0 to MP3 and the memory pillars MP8 to MP11 are arranged in parallel.

The memory pillars MP4 to MP7 and MP12 to MP15 are arranged along the Y-direction. The memory pillars MP4 to MP7 are located between the memory pillars MP0 to MP3 and the memory pillars MP8 to MP11 in the X-direction. The memory pillars MP12 to MP15 are arranged along the Y-direction at positions adjacent to the memory pillars MP4 to MP7 in the X-direction. In other words, the memory pillars MP4 to MP7 and the memory pillars MP12 to MP15 are arranged in parallel.

Two bit lines BL0, BL1 are provided above the memory pillars MP0 to MP3. The bit line BL0 is commonly connected to the memory pillars MP1, MP3. The bit line BL1 is commonly connected to the memory pillars MP0, MP2. Two bit lines BL2, BL3 are provided above the memory pillars MP4 to MP7. The bit line BL2 is commonly connected to the memory pillars MP5, MP7. The bit line BL3 is commonly connected to the memory pillars MP4, MP6.

Two bit lines BL4, BL5 are provided above the memory pillars MP8 to MP11. The bit line BL4 is commonly connected to the memory pillars MP9, MP11. The bit line BL5 are commonly connected to the memory pillars MP8, MP10. Two bit lines BL6, BL7 are provided above the memory pillars MP12 to MP15. The bit line BL6 is commonly connected to the memory pillars MP13, MP15. The bit line BL7 is commonly connected to the memory pillars MP12, MP14.

In the present embodiment, in the Y-direction, the positions of each of the memory pillars MP0 to MP3, MP8 to MP11 are shifted by ½ of a distance between the memory pillars MP with respect to the positions of each of the memory pillars MP4 to MP7, MP12 to MP15. The memory pillars MP0 to MP3, MP8 to MP11 are classified into a group GR0. The memory pillars MP4 to MP7, MP12 to MP15 are classified into a group GR1.

As described above, the memory pillar MP is provided to be embedded in a part of any slits SLT2 between the two wiring layers 10 adjacent to each other in the Y-direction. One slit SLT2 exists between the memory pillars MP adjacent to each other in the Y-direction. In the Y-direction, the slit SLT2 in which the memory pillar MP belonging to the group GR0 is embedded is located between the two memory pillars MP belonging to the group GR1. Similarly, in the Y-direction, the slit SLT2 in which the memory pillar MP belonging to the group GR1 is embedded is located between the two memory pillars MP belonging to the group GR0.

The memory pillar MP is not provided in an area between the wiring layers 10-0a and 10-0c adjacent to each other with the slit SLT1 interposed therebetween. However, from the viewpoint of process stability, the area may be provided with a dummy memory pillar MP which is not connected to the BL.

Figure 6:
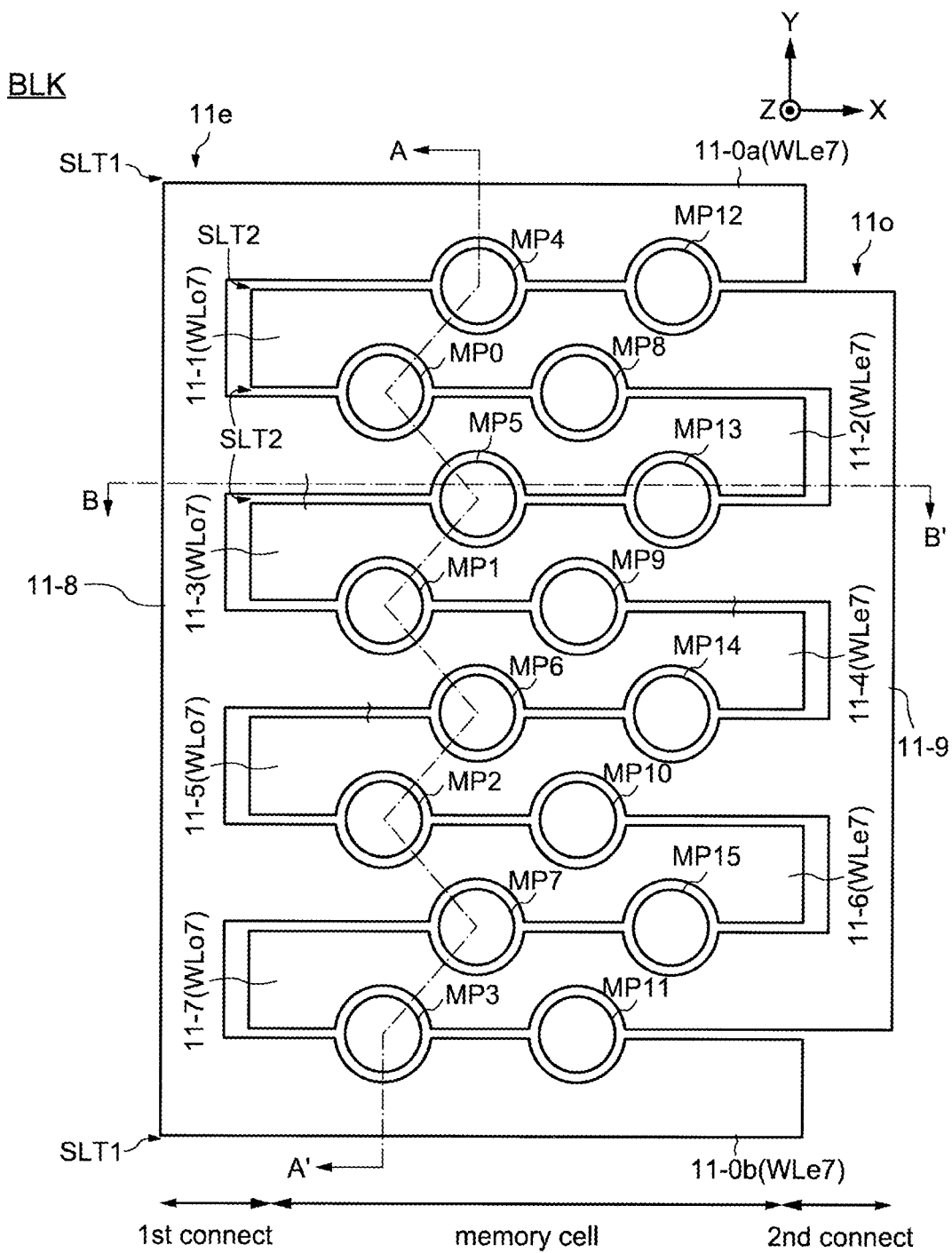
FIG. 6 is a diagram showing a layout of word lines and memory pillars of a semiconductor storage device according to an embodiment.

FIG. 6 shows a planar layout of the word lines WL in the X-Y plane, similar to FIG. 5. FIG. 6 corresponds to one block of the area of FIG. 5 and is a layout of wiring layers 11 provided lower layer than the wiring layer 10 described in FIG. 5.

As shown in FIG. 6, the nine wiring layers 11 (11-0a, 11-0b, 11-1 to 11-7) extending in the X-direction are arranged along the Y-direction. Each wiring layer 11-0a, 11-0b, 11-1 to 11-7 is provided in the lower layer of the wiring layers 10-0 to 10-7 via an insulation layer.

Each wiring layer 11 functions as a word line WL7. Other word lines WL0 to WL6 have the same configuration and function as the word line WL7. As shown in FIG. 6, the wiring layers 11-0a, 11-2, 11-4, 11-6, 11-0b functioning as the word line WLe7 have the longitudinal in the X-direction, respectively, are arranged side by side in the Y-direction. The wiring layers 11-0a, 11-2, 11-4, 11-6, 11-0b are connected by a first connecting section 11-8 (1st connect) having the longitudinal in the Y-direction. The first connect 11-8 is provided at the first end in the X-direction. The wiring layers 11-0a, 11-2, 11-4, 11-6, 11-0b are connected to the row decoder 30 via the first connecting section 11-8. The first connect 11-8 and the wiring layers 11-0a, 11-2, 11-4, 11-6, 11-0b may be collectively referred to as a wiring layer 11e.

The wiring layers 11-1, 11-3, 11-5, 11-7 functioning as the word line WLo7 have the longitudinal in the X-direction, respectively, and are arranged side by side in the Y-direction. These wiring layers 11-1, 11-3, 11-5, 11-7 are connected by a second connect 11-9 having the longitudinal in the Y-direction. The second connecting section 11-9 (2nd connect) is provided at the second end that is an end portion opposite to the first end of the first connecting section 11-8 in the X-direction. The wiring layers 11-1, 11-3, 11-5, 11-7 are connected to the row decoder 30 via the second connecting section 11-9. The second connecting section 11-9 and the wiring layers 11-1, 11-3, 11-5, 11-7 may be collectively referred to as a wiring layer 11o.

The memory cell section (memory cell) is provided between the first connecting section 11-8 and the second connecting section 11-9. A portion of the memory cell section facing to the wiring layer 11e is referred to as a "first memory cell section", and a portion of the memory cell section facing to the wiring layer 11o may be referred to as a "second memory cell section". In the memory cell section, the wiring layers 11 adjacent to each other in the Y-direction are separated by the slit SLT2 described with reference to FIG. 5. The wiring layers 11 between the blocks BLK adjacent to each other in the Y-direction are also separated by the slit SLT1 as described in FIG. 5. In the memory cell section, the memory pillars MP0 to MP15 are provided in the same manner as in FIG. 5.

The select gate line SGS and the word lines WL0 to WL6 have the same configuration as the word line WL7 of FIG. 6.

<Cross-Sectional Structure of Memory Cell Array>

Figure 7:
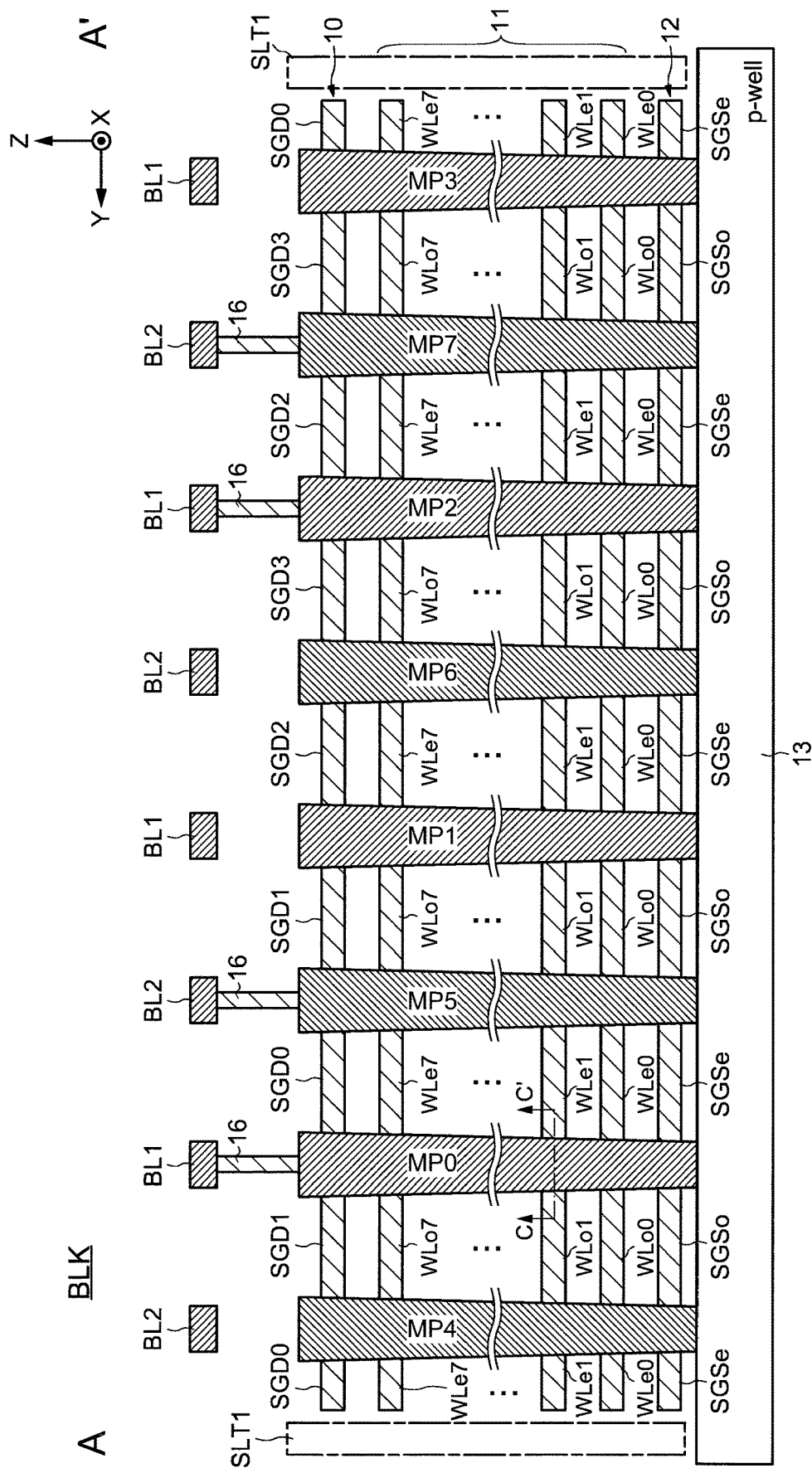
FIG. 7 is a A-A' cross-sectional view of the semiconductor storage device shown in FIG. 6.

The cross-sectional structure of the memory cell array 21 will be described with reference to FIG. 7. FIG. 7 is a A-A' cross-sectional view of the semiconductor storage device shown in FIG. 6.

As shown in FIG. 7, above a p-type well area (p-well) of a semiconductor substrate 13, a wiring layer 12 functioning as the select gate line SGS is provided. Above the wiring layer 12, eight wiring layers 11 functioning as the word lines WL0 to WL7 are stacked along the Z-direction. The planar layout of the wiring layers 11, 12 is similar to the layout shown in FIG. 6. Above the wiring layer 11, the wiring layer 10 functioning as the select gate line SGD is provided. The planar layout of the wiring layer 10 is the layout shown in FIG. 5.

The wiring layer 12 functions as the select gate line SGSo or the select gate line SGSe. The select gate lines SGSo, SGSe are alternately arranged in the Y-direction. The memory pillar MP is provided between the select gate lines SGSo, SGSe adjacent to each other in the Y-direction.

The wiring layer 11 functions as the word line WLo or the word line WLe. The word lines WLo and WLe are alternately arranged in the Y-direction. The memory pillar MP is provided between the word lines WLo, WLe adjacent to each other in the Y-direction. A memory cell described later is provided between the memory pillar MP and the word line WLo and between the memory pillar MP and the word line WLe.

The slit SLT1 is provided between the blocks BLK adjacent to each other in the Y-direction. As described above, the slit SLT1 is provided with an insulation layer. However, a contact plug or the like for supplying a voltage to an area provided in the semiconductor substrate 13 may be provided in the slit SLT1. For example, a contact plug or groove-shaped conductor for connecting the source of the select transistor ST2 to the source line may be provided in the slit SLT1.

The bit lines BL1, BL2 are provided on the memory pillar MP. A contact plug 16 for connecting each memory pillar MP and the bit line BL is provided between the memory pillar MP0 and the bit line BL1 and between the memory pillar MP2 and the bit line BL1. Similarly, the contact plug 16 for connecting each memory pillar MP and the bit line BL is provided between the memory pillar MP5 and the bit line BL2 and between the memory pillar MP7 and the bit line BL2. The other memory pillars MP are connected to the bit line BL1 or the bit line BL2 through the contact plug 16 in an area other than the cross section shown in FIG. 7.

Figure 8:
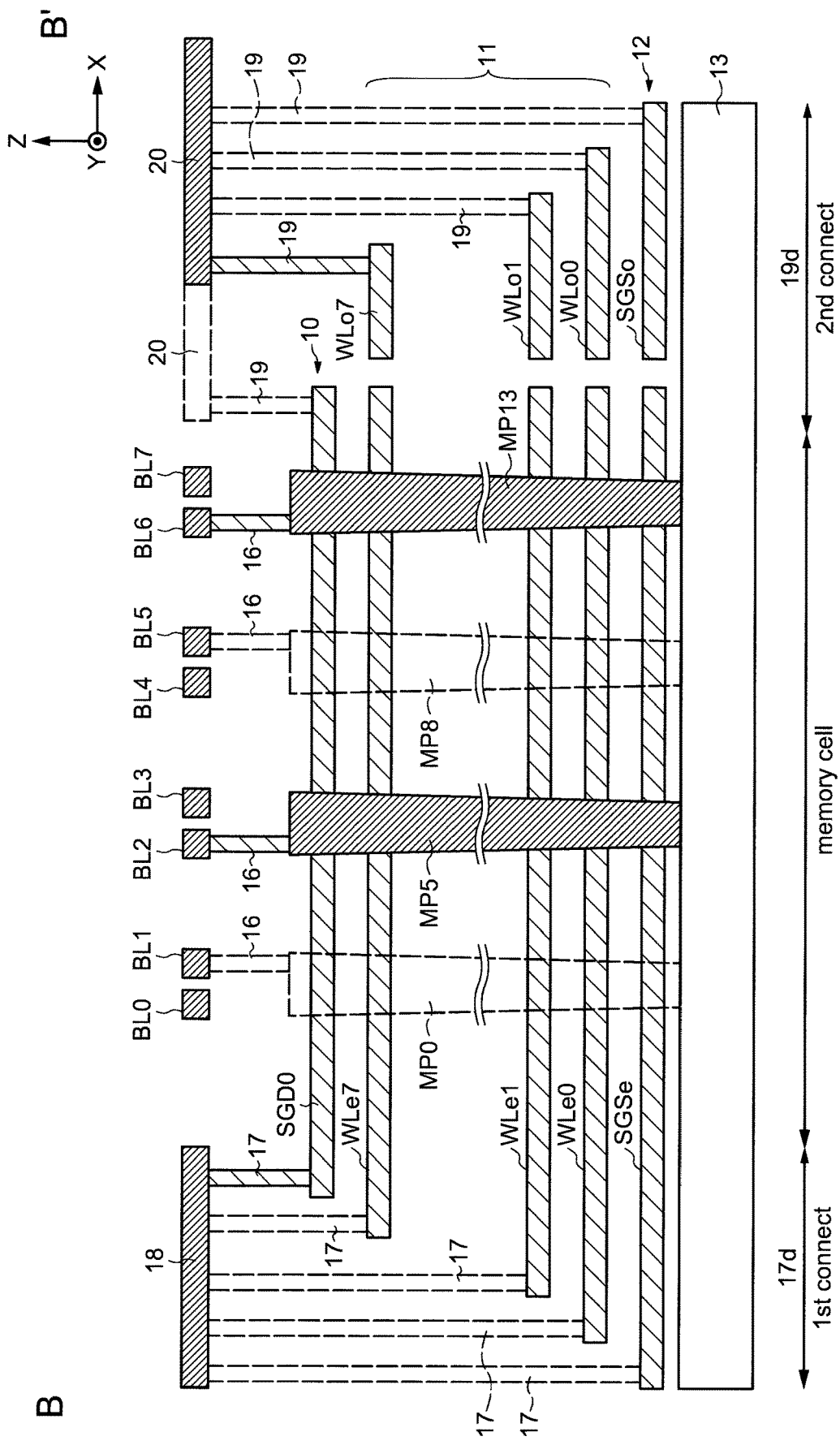
FIG. 8 is a B-B' cross-sectional view of the semiconductor storage device shown in FIG. 6.

FIG. 8 is a B-B' cross-sectional view of the semiconductor storage device shown in FIG. 6. As described in an explanation of FIG. 7, the wiring layers 12, 11, 10 are provided sequentially above the semiconductor substrate 13. In FIG. 8, the configuration existing in the depth direction of the B-B' cross-sectional view is drawn by a dotted line.

In a first connecting section 17d (1st connect), the wiring layers 11, 12 are formed in a stepped shape. That is, when viewed in the X-Y plane, each end portion of the eight wiring layers 11 and the upper surface of the end portion of the wiring layer 12 are exposed in the first connecting section 17d. A contact plug 17 is provided in the wiring layers 11, 12 exposed at the first connecting section 17d. The contact plug 17 is connected to a metal wiring layer 18. The wiring layers 10 to 12 functioning as even select gate lines SGD0, SGD2, SGD4, SGD6, an even word line WLe, and an even select gate line SGSe, are electrically connected to the row decoder 30 via the metal wiring layer 18.

In a second connecting section 19d (2nd connect), similar to the above, the wiring layers 11, 12 are formed in a stepped shape. That is, when viewed in the X-Y plane, each end portion of the eight wiring layers 11 and the upper surface of the end portion of the wiring layer 12 are exposed in the second connecting section 19d. A contact plug 19 is provided in the wiring layers 11, 12 exposed at the second connecting section 19d. The contact plug 19 is connected to a metal wiring layer 20. The wiring layers 11, 12 functioning as odd select gate lines SGD1, SGD3, SGD5, SGD7, an odd word line WLo, and an odd select gate line SGSo are electrically connected to the row decoder 30 via the metal wiring layer 20.

The wiring layer 10 may be electrically connected to the row decoder 30 via the second connecting section 19d instead of the first connecting section 17d, and may be electrically connected to the row decoder 30 via both the first connecting section 17d and the second connecting section 19d.

<Structure of Memory Pillar and Memory Cell Transistor>

The structures of the memory pillar MP and the memory cell transistor MT will be described with reference to FIGS. 9 and 10.

First Example

The configurations of the memory pillar MP and the memory cell transistor MT according to a first example will be described with reference to FIGS. 9 and 10. FIG. 9 is a C-C' cross-sectional view of the memory cell shown in FIG. 7. FIG. 10 is a D-D' cross-sectional view of the memory cell shown in FIG. 9. In the first example, a floating gate type memory cell transistor MT is shown in which a conductive layer is used as the charge storage layer of the memory cell transistor MT.

Figure 9:
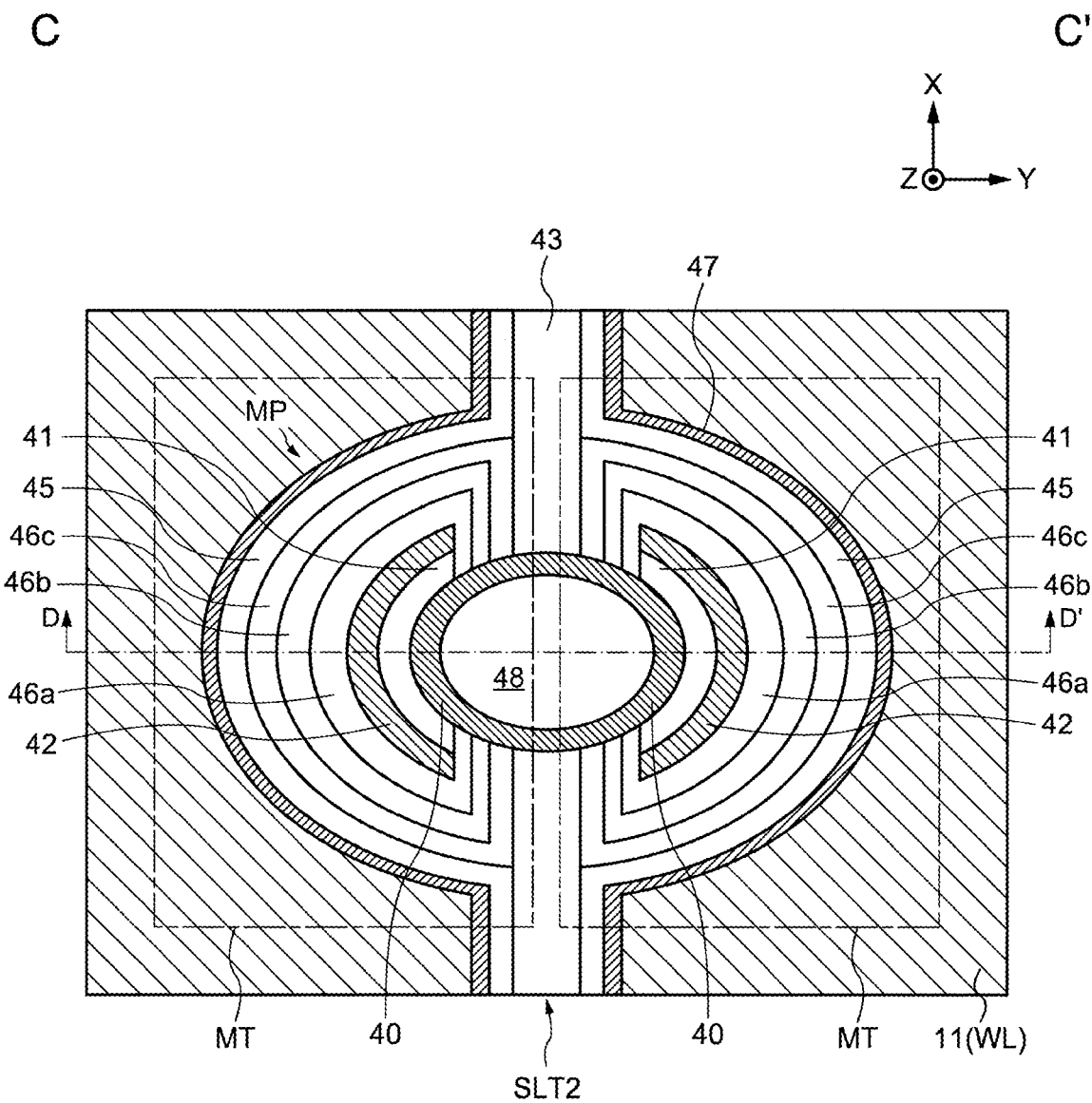
FIG. 9 is a C-C' cross-sectional view of the memory cell shown in FIG. 7.
Figure 10:
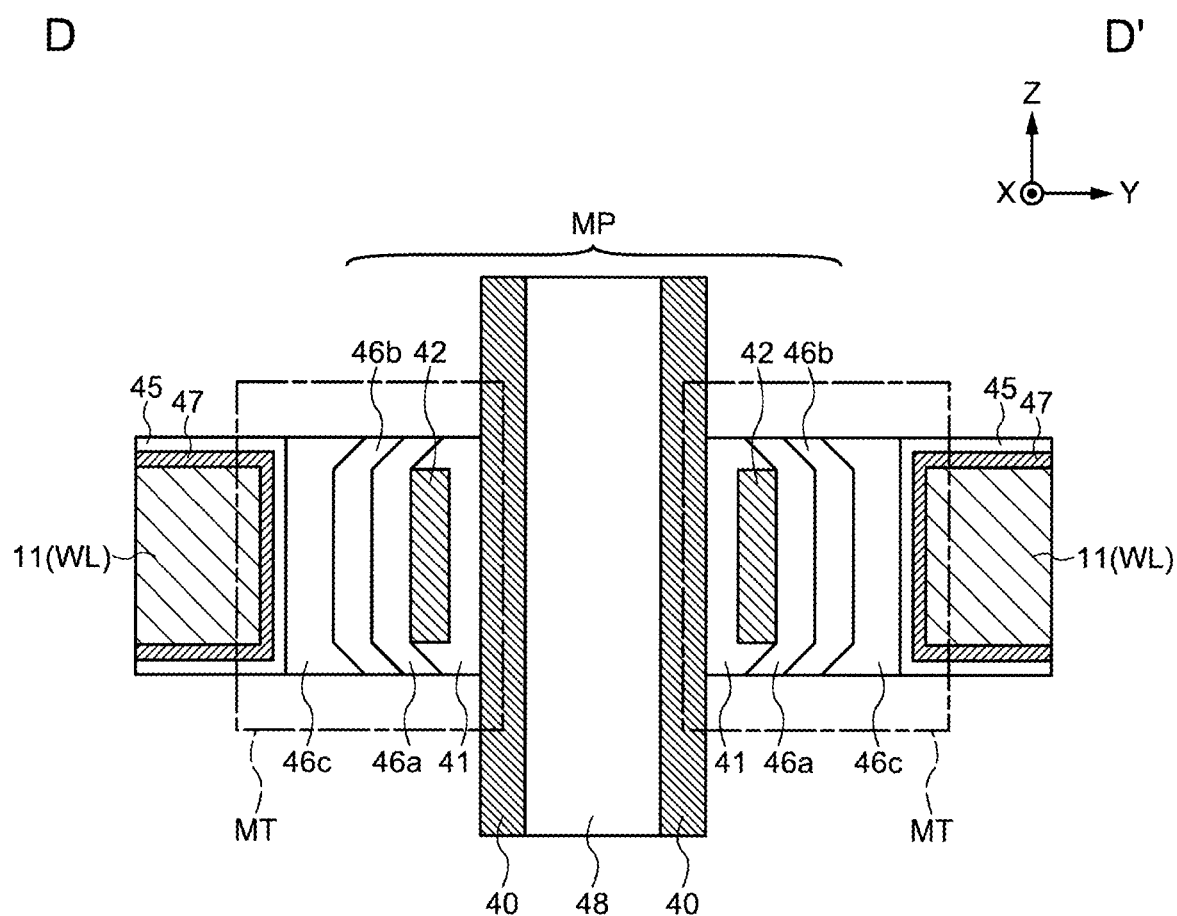
FIG. 10 is a D-D' cross-sectional view of the memory cell shown in FIG. 9.

As shown in FIGS. 9 and 10, the memory pillars MP include insulation layers 48, 43, a semiconductor layer 40, an insulation layer 41, a conductive layer 42, and insulation layers 46a to 46c provided along the Z-direction. The insulation layer 48 is, for example, a silicon oxide layer. The semiconductor layer 40 is provided to surround the periphery of the insulation layer 48. The semiconductor layer 40 is, for example, a polycrystalline silicon layer. The semiconductor layer 40 functions as a channel of the memory cell transistor MT. The semiconductor layer 40 is provided continuously between the two memory cell transistors MT included in one memory pillar MP and is not separated for each memory cell transistor MT.

As described above, the semiconductor layer 40 is continuous between the two facing to memory cell transistors MT. Therefore, the two channels formed in the two memory cell transistors MT share a part of the memory pillar MP. Specifically, in FIG. 9, in the memory cell transistor MT on the left side and the memory cell transistor MT on the right side facing to each other, the channel formed in the memory cell transistor MT on the left side and the channel formed in the memory cell transistor MT on the right side share a part of the memory pillar MP. The two channels share a part of the memory pillar MP means that the two channels are formed in the same memory pillar MP and that the two channels are partially overlapped. The above configuration may be referred to as that the two memory cell transistors MT are sharing the channel or the two memory cell transistors MT are facing to each other.

The insulation layer 41 is provided around the semiconductor layer 40 and functions as a gate insulation layer of each memory cell transistor MT. The insulation layer 41 is separated into two areas in the X-Y plane shown in FIG. 9. Each of the insulation layers 41 functions as the gate insulation layer of the two memory cell transistors MT included in one memory pillar MP. The insulation layer 41 is, for example, a stacked structure of the silicon oxide layer and the silicon nitride layer. The conductive layer 42 is provided around the insulation layer 41 and is separated into two areas along the Y-direction by the insulation layer 43. The conductive layer 42 is, for example, a polycrystalline silicon layer having conductivity. Each of the separated conductive layers 42 functions as the charge storage layer of the two memory cell transistors MT described above.

The insulation layer 43 is, for example, a silicon oxide layer. Around the conductive layer 42, the insulation layers 46a, 46b, 46c are provided sequentially. The insulation layers 46a, 46c are, for example, silicon oxide layers. The insulation layer 46b is, for example, a silicon nitride layer. The insulation layers function as block insulation layers of the memory cell transistor MT. The insulation layers 46a to 46b are also separated into two areas along the Y-direction. The insulation layer 43 is provided between the separated insulation layers 46a to 46b. The insulation layer 43 is embedded in the slit SLT2. The insulation layer 43 is, for example, a silicon oxide layer.

Around the memory pillar MP having the above-described configuration, an AlO layer 45 is provided, for example. Around the AlO layer 45, a barrier metal layer 47 (TiN layer or the like) is provided, for example. Around the barrier metal layer 47, the wiring layer 11 functioning as the word line WL is provided. The wiring layer 11 is, for example, tungsten.

According to the above configuration, two memory cell transistors MT are provided in one memory pillar MP along the Y-direction. The select transistors ST1 and ST2 also have the same configuration as described above. An insulation layer (not shown) is provided between the memory cell transistors adjacent to each other in the Z-direction. By the insulation layer and the insulation layers 43, 46, the conductive layer 42 is insulated for each individual memory cell transistor.

Example 2

Figure 11:
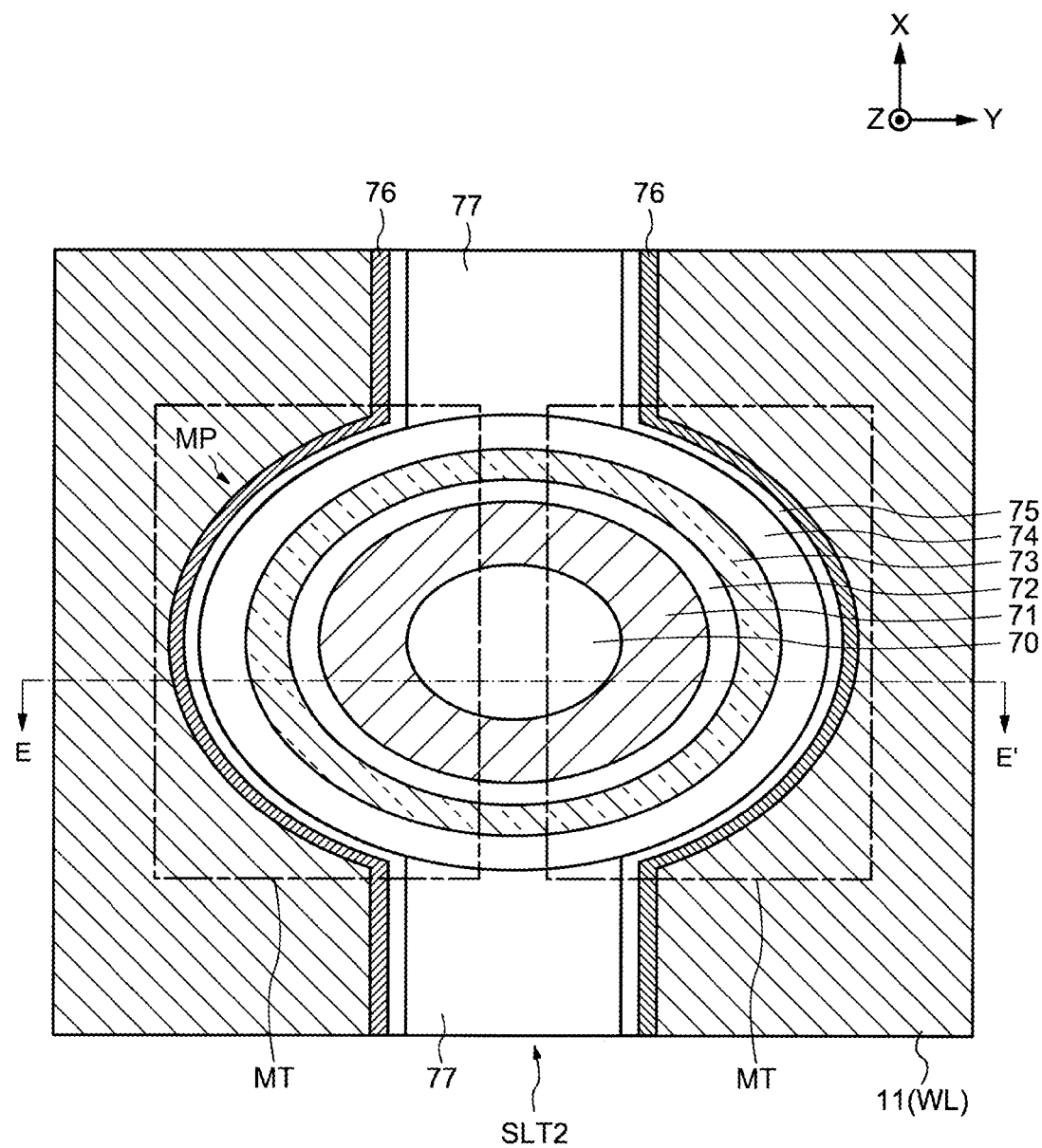
FIG. 11 is a modification of the memory cell shown in FIG. 9.
Figure 12:
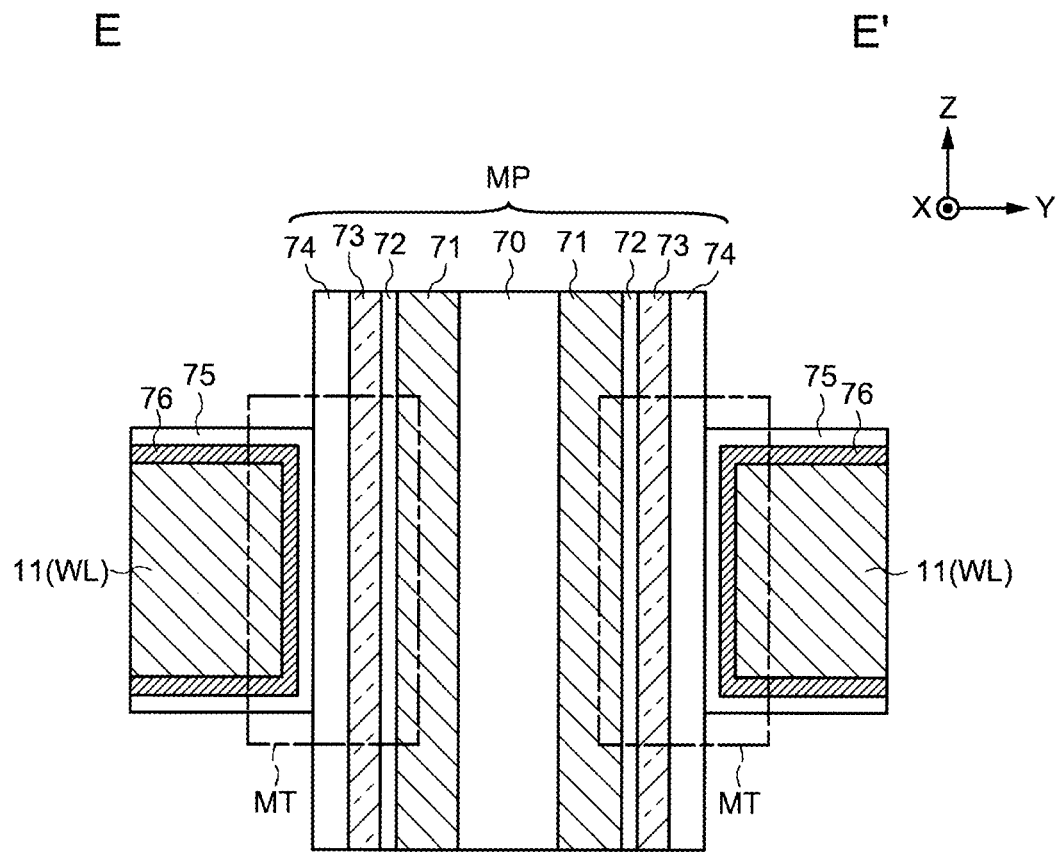
FIG. 12 is an E-E' cross-sectional view of the memory cell shown in FIG. 11.

The configurations of the memory pillar MP and the memory cell transistor MT according to a second example will be described with reference to FIGS. 11 and 12. FIG. 11 is a modification of the memory cell shown in FIG. 9. FIG. 12 is an E-E' cross-sectional view of the memory cell shown in FIG. 11. In the second example, a MONOS type memory cell transistor MT that an insulation layer is used in the charge storage layer of the memory cell transistor MT is shown.

As shown in FIGS. 11 and 12, the memory pillar MP includes an insulation layer 70, a semiconductor layer 71, and insulation layers 72 to 74 provided along the Z-direction. The insulation layer 70 is, for example, a silicon oxide layer. The semiconductor layer 71 is provided to surround the periphery of the insulation layer 70. The semiconductor layer 71 functions as the channel of the memory cell transistor MT. The semiconductor layer 71 is, for example, a polycrystalline silicon layer. The semiconductor layer 71 is continuously provided between the two memory cell transistors MT included in one memory pillar MP. Therefore, the channels formed in each of the two memory cell transistors MT share a part of the memory pillar MP.

The insulation layer 72 is provided to surround the semiconductor layer 71, and functions as the gate insulation layer of the memory cell transistor MT. The insulation layer 72 is, for example, a stacked structure of a silicon oxide layer and a silicon nitride layer. The insulation layer 73 is provided to surround the periphery of the semiconductor layer 71 and functions as the charge storage layer of the memory cell transistor MT. The insulation layer 73 is, for example, a silicon nitride layer. The insulation layer 74 is provided to surround the periphery of the insulation layer 73 and functions as the block insulation layer of the memory cell transistor MT. The insulation layer 74 is, for example, a silicon oxide layer. An insulation layer 77 is embedded in the slit SLT2 except for the memory pillar MP portion. The insulation layer 77 is, for example, a silicon oxide layer.

For example, around the memory pillar MP having the above-described configuration, an AlO layer 75 is provided. For example, around the AlO layer 75, a barrier metal layer 76 (TiN layer or the like) is provided. Around the barrier metal layer 76, the wiring layer 11 functioning as the word line WL is provided. The wiring layer 11 is, for example, tungsten.

According to the above configuration, two memory cell transistors MT are provided in one memory pillar MP along the Y-direction. The select transistors ST1 and ST2 also have the same configuration as described above.

[Equivalent Circuit]

Figure 13:
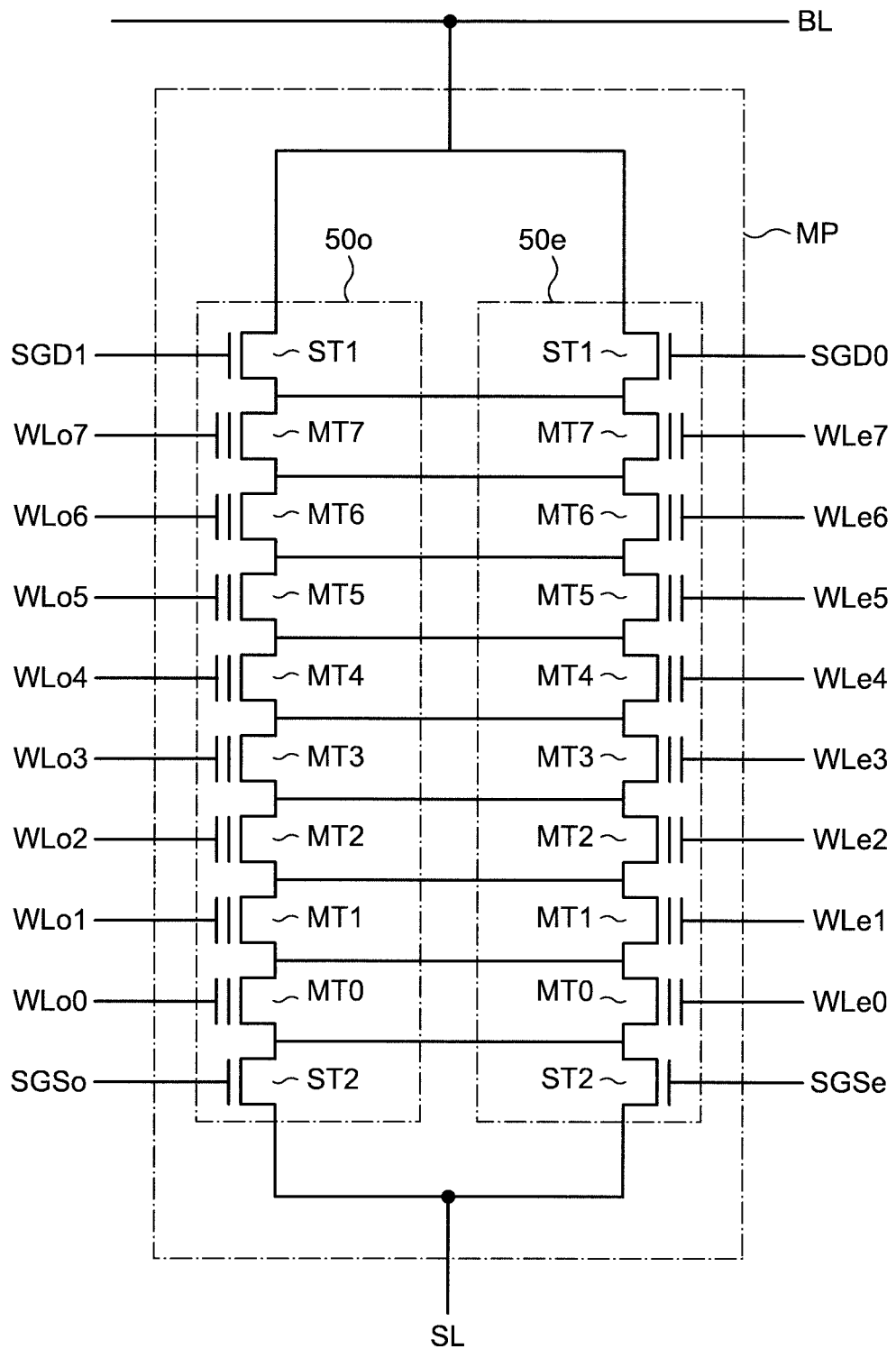
FIG. 13 is a diagram showing an equivalent circuit of adjacent strings in a semiconductor storage device according to an embodiment.

FIG. 13 is a diagram showing an equivalent circuit of the adjacent strings in the semiconductor storage device according to an embodiment. As shown in FIG. 13, the two NAND strings 50o, 50e are formed in one memory pillar MP. Each of the NAND strings 50o, 50e has the select transistor ST1, the memory cell transistors MT0 to MT7, and the select transistor ST2, connected in series.

The select transistor ST1 of the NAND string 50o is connected to the select gate line SGD1. The select transistor ST1 of the NAND string 50e is connected to the select gate line SGD0. The memory cell transistors MT0 to MT7 of the NAND string 50o are connected to the word lines WLo0 to WLo7, respectively. The memory cell transistors MT0 to MT7 of the NAND string 50e are connected to the word lines WLe0 to WLe7, respectively. Among the word lines WLo0 to WLo7, the word line WLo0 is the lowermost layer and the word line WLo7 is the uppermost layer. Among the word lines WLe0 to WLe7, the word line WLe0 is the lowermost layer and the word line WLe7 is the uppermost layer. The select transistor ST2 of the NAND string 50o is connected to the select gate line SGSo. The select transistor ST2 of the NAND string 50e is connected to the select gate line SGSe.

The sources of the select transistors ST1 facing to each other are electrically connected. The drains of the select transistors ST1 facing to each other are electrically connected. The sources of the each of memory cell transistors MT0 to 7 facing to each other are electrically connected. The drains of the each of memory cell transistors MT0 to 7 facing to each other are electrically connected. The sources of the select transistors ST2 facing to each other are electrically connected. The drains of the select transistors ST2 facing to each other are electrically connected. The electrical connection described above is due to the channels formed in the facing to transistors sharing a part of the memory pillar MP.

The two NAND strings 50o, 50e in the same memory pillar MP are connected to the same bit line BL and the same source line SL.

[Write Operation]

With reference to FIGS. 5 and 14 to 17, the write operation to the memory cell transistor MT in the block BLK is explained. FIGS. 14 to 17 are diagrams illustrating the write operation referring to the layouts of the word lines and memory pillars of the semiconductor storage device according to an embodiment. In FIGS. 14 to 17, the memory pillars MP (MP0 to MP15) and the word lines WL (the word lines WLe0, WLo0 which are the lowermost layer of the word lines) are shown. The memory cell transistor MT is provided in an area where the memory pillar MP and word line WL are adjacent to each other.

When the write operation is performed, one of the select gate lines SGD0 to SGD3 shown in FIG. 5 is selected. The write operation is performed on the memory cell transistor MT belonging to the same NAND string 50o or 50e as the select transistor ST1 corresponding to the selected select gate line.

One wiring layer of 10-0 to 10-3 corresponding to each select gate line is supplied with a voltage that the select transistor ST1 turns on or off depending on the voltage supplied to the bit line BL.

Among the word lines WL0 to 7, a voltage for performing the write operation to the memory cell transistor MT is supplied to the wiring layer 11e or 11o corresponding to the memory cell transistor MT that is the target of the write operation. For example, the voltage for performing the write operation is a voltage for injecting electrons from the semiconductor layer 71 into the insulation layer 73. The semiconductor layer 71 functions as the channel. The insulation layer 73 functions as the charge storage layer.

When the select gate line SGD0 (the wiring layer 10-0) is selected and a voltage for performing the write operation to the lowermost word line WLe0 is supplied, the write operation is performed on the memory cell transistor MT located in the lowermost layer of the NAND string 50e in the memory pillars MP0, MP3, MP4, MP5, MP8, MP11, MP12, MP13.

When the select gate line SGD1 (the wiring layer 10-1) is selected and the voltage for performing the write operation to the lowermost word line WLo0 is supplied, the write operation is performed on the memory cell transistor MT located in the lowermost layer of the NAND string 50o in the memory pillars MP0, MP1, MP4, MP5, MP8, MP9, MP12, MP13.

When the select gate line SGD2 (the wiring layer 10-2) is selected and the voltage for performing the write operation to the lowermost word line WLe0 is supplied, the write operation is performed on the memory cell transistor MT located in the lowermost layer of the NAND string 50e in the memory pillars MP1, MP2, MP6, MP7, MP9, MP10, MP14, MP15.

When the select gate line SGD3 (the wiring layer 10-3) is selected and the voltage for performing the write operation to the lowermost word line WLo0 is supplied, the write operation is performed on the memory cell transistor MT located in the lowermost layer of the NAND string 50o in the memory pillars MP2, MP3, MP6, MP7, MP10, MP11, MP14, MP15.

In the block BLK, a group of the memory cell transistors MT in which are the target of the simultaneous write operation may be referred to as a "page".

The word line WLe provided in the wiring layer 11e may be referred to as a "first word line". The word line WLo provided in the wiring layer 11o may be referred to as a "second word line". The first word line and the second word line are controlled independently of each other. The memory pillar MP is sandwiched by the word line WLe (the first word line) and the word line WLo (the second word line). Among the memory cell transistors MT provided in the memory pillar MP, the memory cell transistor facing to the word line WLe (the first word line) is referred to as the "first memory cell" and the memory cell transistor facing to the word line WLo (the second word line) is referred to as the "second memory cell". The plurality of memory pillars MP are arranged in the X-direction and the Y-direction.

Contrary to the present embodiment, when the write operation is performed on the memory cell transistor MT facing to the word line WLe after the write operation is performed to the memory cell transistor MT facing to the word line WLo, the word line WLo is referred to as a first word line, the word line WLe is referred to as a second word line, the memory cell transistor MT facing to the word line WLo is referred to as a first memory cell, and the memory cell transistor MT facing to the word line WLe is referred to as a second memory cell. That is, in the two memory cell transistors MT facing to each other, the memory cell transistor MT in which the write operation is performed first is referred to as the first memory cell, and the memory cell transistor MT in which the write operation is performed later is referred to as the second memory cell.

Although the details will be described later, in the present embodiment, the write operation is performed by selecting in the order of the select gate lines SGD0→SGD2→SGD1→SGD3. In other words, in a first write operation, the write operation is performed on the first memory cell facing to the wiring layer 11e (11-0a, 11-0b, 11-2, 11-4, 11-6) that functions as the word line WLe (the first word line) among the plurality of word lines 11 (11-0a, 11-0b, 11-1 to 11-7). In a second write operation after the first write operation, the write operation is performed on the second memory cell facing to the wiring layer 11o (11-1, 11-3, 11-5, 11-7) that functions as the word line WLo (the second word line).

Figure 14:
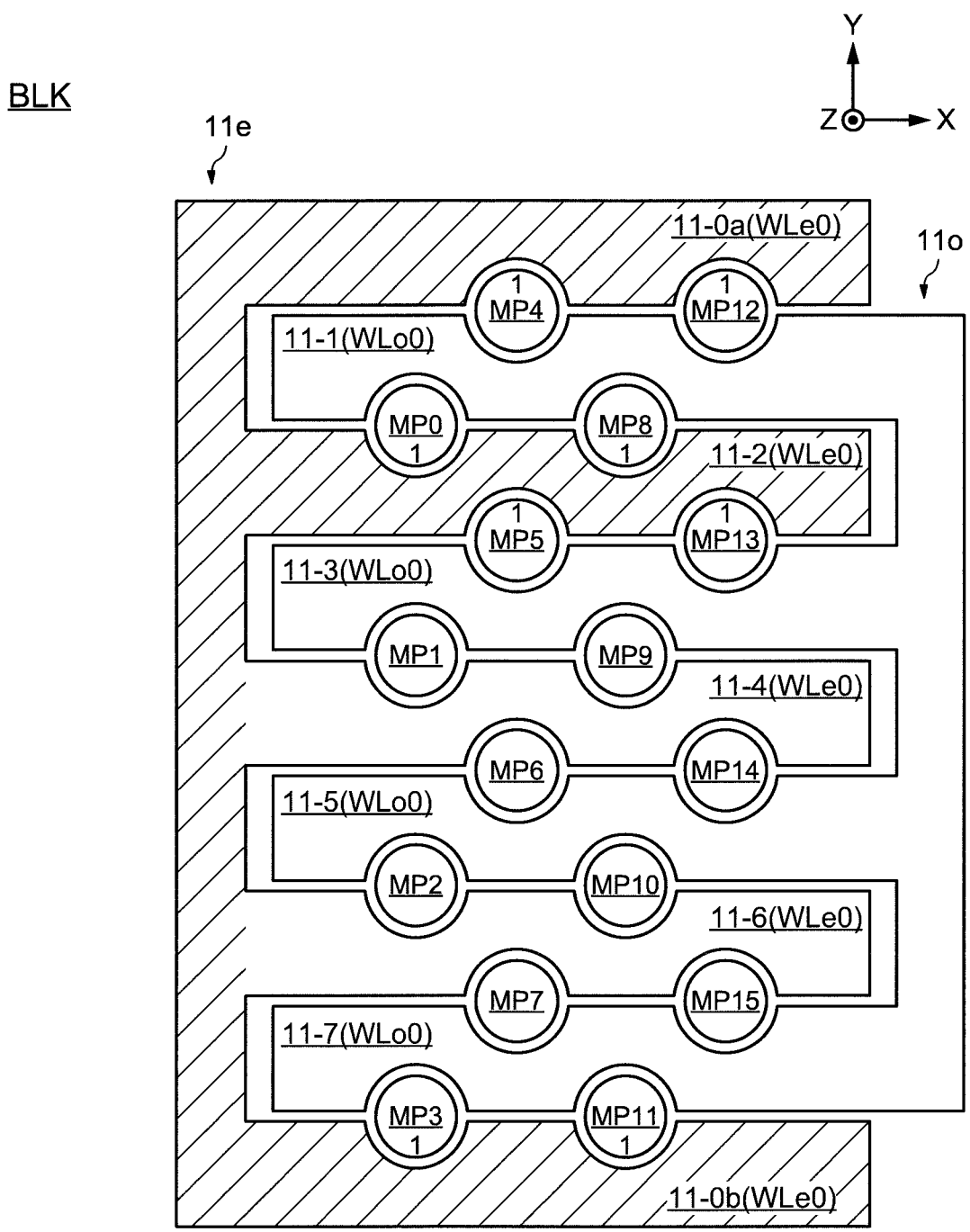
FIG. 14 is a diagram illustrating a write operation referring to a layout of word lines and memory pillars of a semiconductor storage device according to an embodiment.

Referring to FIG. 14, as the first write operation to the memory cell transistor MT facing to the lowermost word line WLe0 or WLo0, a case that the write operation is performed on the memory cell transistor MT belonging to the NAND string 50e selected by the select gate line SGD0 shown in FIG. 5 will be described. When the select gate line SGD0 is selected, depending on the voltage supplied to the bit line, the select transistor ST1 facing to the wiring layers 10-0a, 10-0b, 10-0c shown in FIG. 5 is turned on or turned off. In FIG. 14, an area (a hatching area) of the wiring layer 11e indicated by the hatching of the diagonal line corresponds to an area where the wiring layers 10-0a, 10-0b, 10-0c in FIG. 5 are arranged. That is, when the select gate line SGD0 is selected, the write operation is performed on the memory cell transistor MT facing to the wiring layer 11e of the hatching area in FIG. 14.

As shown in FIG. 14, when the select gate line SGD0 (see FIG. 5) is selected, the write operation is performed on the memory cell transistor MT provided on the word line WLe0 side of each of the memory pillars MP0, MP3, MP4, MP5, MP8, MP11, MP12, MP13. In FIG. 14, "1" is indicated at a position corresponding to the memory cell transistor MT to which data has been written by the write operation (the first write operation).

Figure 15:
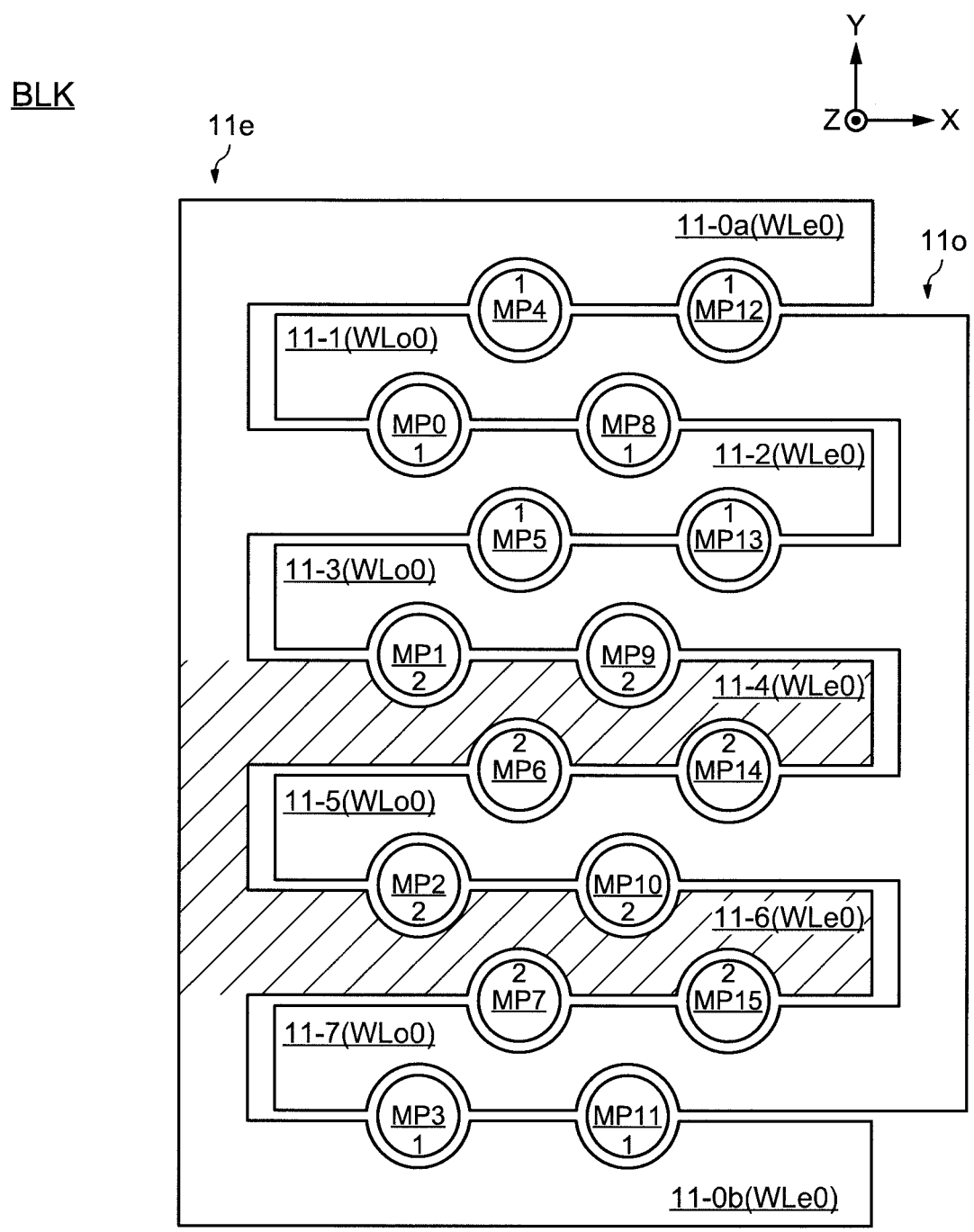
FIG. 15 is a diagram illustrating a write operation referring to a layout of word lines and memory pillars of a semiconductor storage device according to an embodiment.

Referring to FIG. 15, the second write operation performed following the first write operation described above is described. The second write operation is a write operation to the memory cell transistor MT corresponding to the lowermost word line WLe0 or WLo0. In the second write operation, the write operation is performed on the memory cell transistor MT belonging to the NAND string 50e selected by the select gate line SGD2 shown in FIG. 5. When the select gate line SGD2 is selected, depending on the voltage supplied to the bit line, the select transistor ST1 facing to the wiring layers 10-2a, 10-2b shown in FIG. 5 is turned on or turned off. In FIG. 15, the hatching area of the wiring layer 11e corresponds to the area where the wiring layers 10-2a, 10-2b shown in FIG. 5 are arranged. That is, when the select gate line SGD2 is selected, the write operation is performed on the memory cell transistor MT facing to the wiring layer 11e of the hatching area in FIG. 15.

As shown in FIG. 15, when the select gate line SGD2 (see FIG. 5) is selected, the write operation is performed on the memory cell transistor MT provided on the word line WLe0 side of each of the memory pillars MP1, MP2, MP6, MP7, MP9, MP10, MP14, MP15. In FIG. 15, "2" is indicated at a position corresponding to the memory cell transistor MT to which data has been written by the write operation (the second write operation).

By the write operation shown in FIGS. 14 and 15, the write operation to all the memory cell transistors MT facing to the word line WLe0 formed in all the memory pillars MP0 to MP15 sandwiched between the word lines WLe0 and WLo0 is completed. In this state, the memory cell transistor MT formed in the memory pillars MP0 to MP15 and facing to the word line WLo0 has not yet been performed to the write operation.

Figure 16:
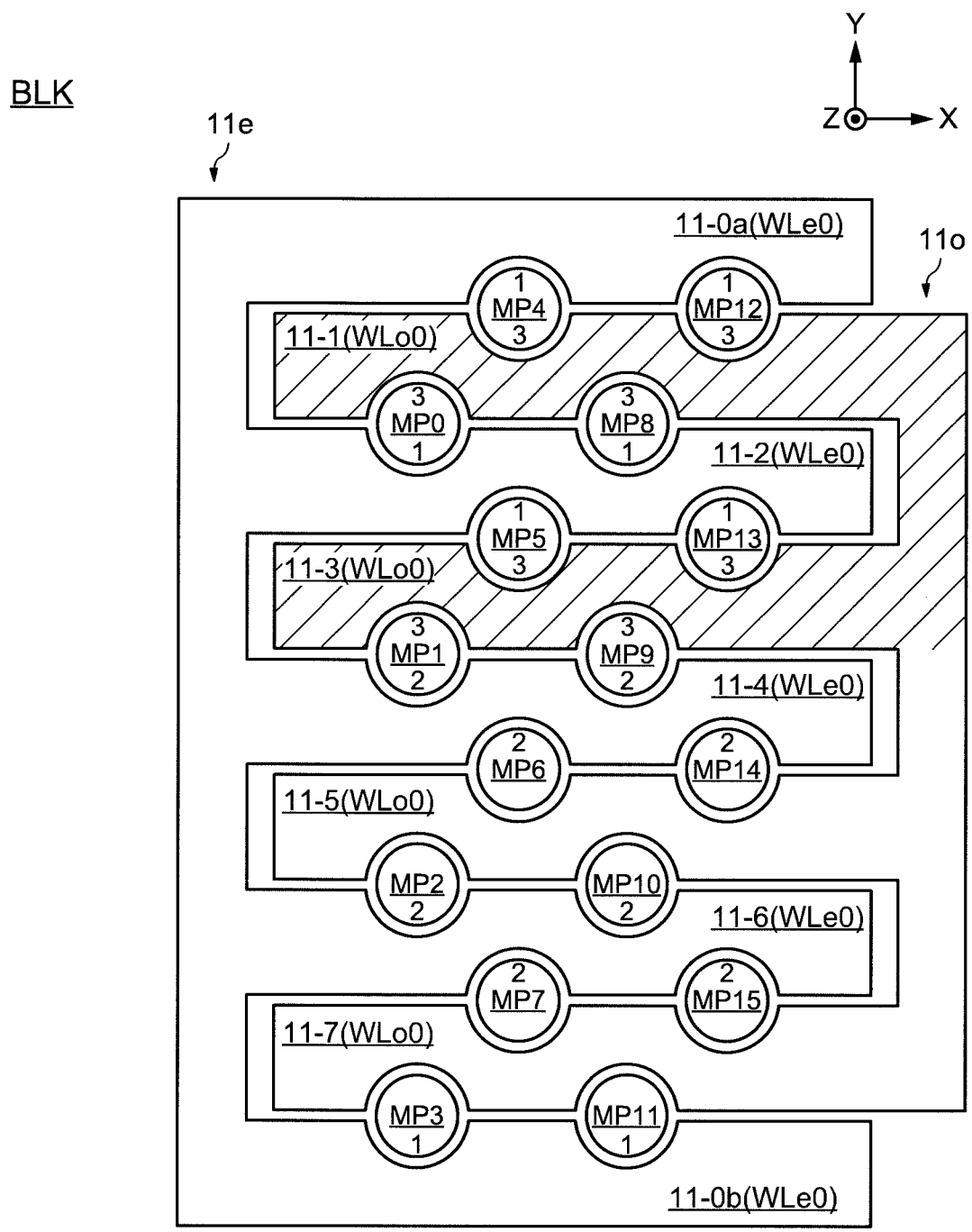
FIG. 16 is a diagram illustrating a write operation referring to a layout of word lines and memory pillars of a semiconductor storage device according to an embodiment.

Referring to FIG. 16, a third write operation performed following the first and second write operations is described. The third write operation is a write operation to the memory cell transistor MT corresponding to the lowermost word line WLe0 or WLo0. In the third write operation, the write operation is performed on the memory cell transistor MT belonging to the NAND string 50o selected by the select gate line SGD1 shown in FIG. 5. When the select gate line SGD1 is selected, depending on the voltage supplied to the bit line, the select transistor ST1 facing to the wiring layers 10-1a, 10-1b shown in FIG. 5 is turned on or turned off. In FIG. 16, a hatching area of the wiring layer 11o corresponds to the area where the wiring layers 10-1a, 10-1b in FIG. 5 is arranged. That is, when the select gate line SGD1 is selected, the write operation is performed on the memory cell transistor MT facing to the wiring layer 11o of the hatching area in FIG. 16.

As shown in FIG. 16, when the select gate line SGD1 (see FIG. 5) is selected, the write operation is performed on the memory cell transistor MT provided on the word line WLo0 side of each of the memory pillars MP0, MP1, MP4, MP5, MP8, MP9, MP12, MP13. In FIG. 16, "3" is indicated at a position corresponding to the memory cell transistor MT to which data has been written by the write operation (the third write operation).

Figure 17:
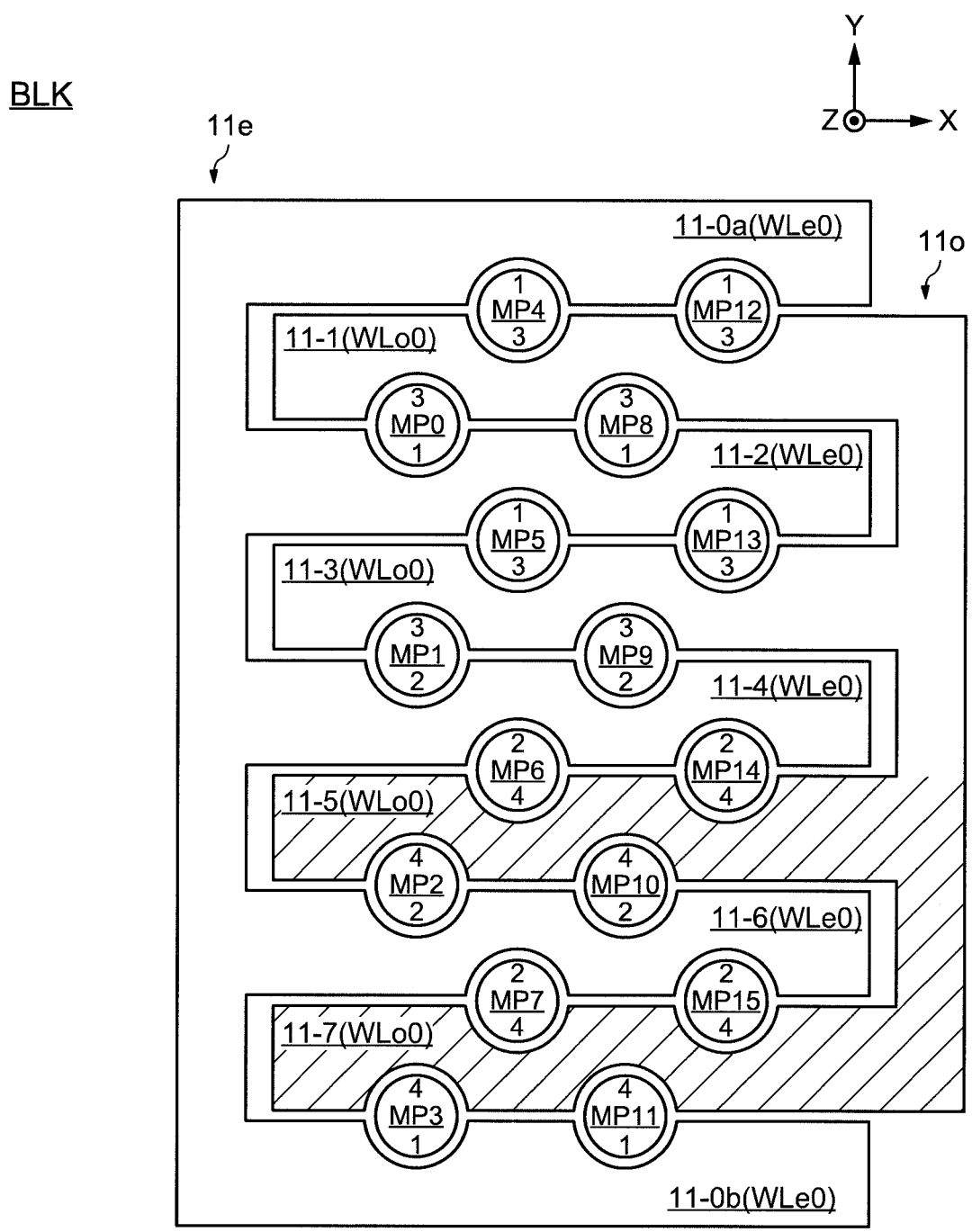
FIG. 17 is a diagram illustrating a write operation referring to a layout of word lines and memory pillars of a semiconductor storage device according to an embodiment.

Referring to FIG. 17, a fourth write operation performed following the first to third write operations described above is described. The fourth write operation is a write operation to the memory cell transistor MT corresponding to the lowermost word line WLe0 or WLo0. In the fourth write operation, the write operation is performed on the memory cell transistor MT belonging to the NAND string 50o selected by the select gate line SGD3 shown in FIG. 5. When the select gate line SGD3 is selected, depending on the voltage supplied to the bit line, the select transistor ST1 facing to the wiring layers 10-3a, 10-3b shown in FIG. 5 is turned on or turned off. In FIG. 17, the hatching area of the wiring layer 11o corresponds to the area where the wiring layers 10-3a, 10-3b in FIG. 5 are arranged. That is, when the select gate line SGD3 is selected, the write operation is performed on the memory cell transistor MT facing to the wiring layer 11o of the hatching area in FIG. 17.

As shown in FIG. 17, when the select gate line SGD3 (see FIG. 5) is selected, the write operation is performed on the memory cell transistor MT provided on the word line WLo0 side of each of the memory pillars MP2, MP3, MP6, MP7, MP10, MP11, MP14, MP15. In FIG. 17, "4" is indicated at a position corresponding to the memory cell transistor MT to which data has been written by the write operation (the fourth write operation).

By the write operations shown in FIGS. 16 and 17, the write operation to all the memory cell transistors MT facing to the word line WLo0 formed in all the memory pillars MP0 to MP15 sandwiched between the word lines WLe0 and WLo0 is completed.

[Interference Caused by Write Operation to the Other Memory Cells]

Figure 18:
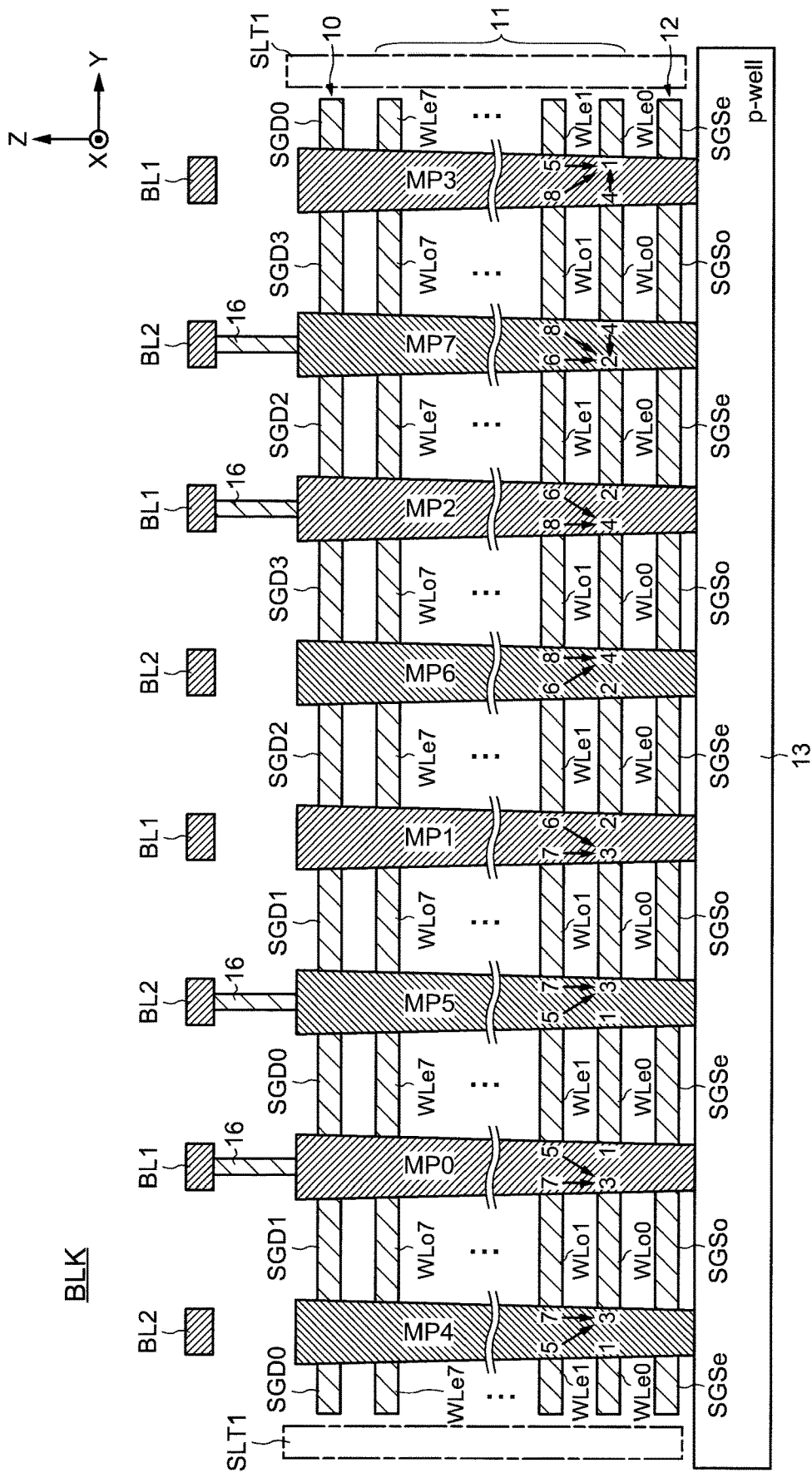
FIG. 18 is a diagram illustrating how a target memory cell receives interference caused by a write operation to another memory cell in a semiconductor storage device according to an embodiment.

Referring to FIG. 18, an effect of interference caused by the write operation of the other memory cells on the written memory cell will be described. In FIG. 18, the numbers (1 to 4) written on the word line WL side of each memory pillar MP correspond to the numbers indicating the order of the write operation that has been written on each memory pillar MP in FIGS. 14 to 17. Similar to the above, the numbers (5 to 8) shown in FIG. 18 are also numbers indicating the order of the write operation. In FIG. 18, after the write operation to the memory cell transistor MT provided in each memory pillar MP facing to the word lines WLe0 and WLo0 is completed, the write operation to the memory cell transistor MT provided in each memory pillar MP facing to the word lines WLe1 and WLo1 is performed. The word lines WLe1 and WLo1 are the word lines formed on the wiring layer 11 provided on the upper layer of the word lines WLe0 and WLo0.

In the memory cell transistor MT according to the present embodiment, the threshold voltage of the written memory cell transistor MT (target memory cell transistor MT) varies depending on the write operation of the other memory cell transistors MT performed after the writing of the memory cell transistor MT. In this way, a case where the threshold voltage of the target memory cell transistor MT varies with the write operation of the other memory cell transistors MT may be referred to as interference occurs.

In particular, the write operation to the memory cell transistor MT described in the following (1) to (3) causes interference to the target memory cell transistor MT.

(1) A first memory cell transistor MT facing to the target memory cell transistor MT (the first memory cell transistor MT formed in the same memory pillar MP as the target memory cell transistor MT, or the first memory cell transistor MT sharing the channel with the target memory cell transistor MT).

(2) A second memory cell transistor MT belonging to the same memory pillar MP as the target memory cell transistor MT and being adjacent to the target memory cell transistor MT in the Z-direction.

(3) A third memory cell transistor MT facing to the second memory cell transistor MT.

As described above, when interference to the target memory cell transistor MT occurs, the written data (the threshold voltage varies by injecting the charge into the charge storage layer) in the target memory cell transistor MT may vary. Therefore, in a condition that the number of times that interference occurs in the memory cell transistor MTa is larger than the number of times that interference occurs in the memory cell transistor MTb, it is necessary that a width of the threshold voltage distribution of a memory cell transistor MTa is smaller than a width of the threshold voltage distribution of a memory cell transistor MTb. In the present embodiment, one page is formed corresponding to each of the select gate lines SGD0 to 3. For example, when the select gate line SGD0 is selected, one page is formed by the memory cell transistors MT provided on the word line WLe0 side of each of the memory pillars MP0, MP3, MP4, MP5, MP8, MP11, MP12, MP13, as shown in FIG. 14. For example, even when only a part of the memory cell transistors MT among the memory cell transistors MT belonging to a certain page is affected by the interference, the write operation must be performed considering the width of the threshold voltage distribution after the memory cell transistor MT is interfered. That is, even when only a part of the memory cell transistors MT belonging to a certain page is affected by the interference, the accuracy of the write operation needs to be increased.

As shown in FIG. 18, in the present embodiment, write operation to the memory cell transistor MT on the word line WLe0 side of each of the memory pillar MP is completed by the first write operation and the second write operation. Thereafter, write operation to the memory cell transistor MT on the word line WLo0 sides of each of the memory pillar MP is performed by the third write operation and the fourth write operation. In the memory cell transistor MT to which the third write operation and the fourth write operation are performed, the first write operation and the second write operation have already been performed. That is, after the write operation to the memory cell transistor MT provided on a first side of each of the memory pillar MP among all the memory cell transistors MT facing to the word lines WLe0 and WLo0 is completed, the write operation to the memory cell transistor MT provided on a second side of each of the memory pillar MP is performed.

For the written memory cell transistor MT facing to the word line WLe0, the rightmost memory pillar MP3 as shown in FIG. 18, for example, the memory cell transistor MT that is the target of the first write operation receives three times of interferences by the fourth write operation, the fifth write operation, and the eighth write operation. Similarly, for example, the second memory pillar MP7 from the right as shown in FIG. 18, the memory cell transistor MT that is the target of the second write operation receives three times of interferences by the fourth write operation, the sixth write operation, and the eighth write operation.

On the other hand, with respect to the written memory cell transistor MT facing to the word line WLo0, the memory cell transistor MT, which is the target of the third write operation, for example, like the four memory pillars MP4, MP0, MP5, MP1 from the left in FIG. 18, receives only two times of interferences by the fifth write operation and the seventh write operation or by the sixth write operation and the seventh write operation. Similarly, the memory cell transistor MT, which is the target of the fourth write operation, for example, like the third and fourth memory pillars MP2, MP6 from the right in FIG. 18, receives only two times of interferences by the sixth write operation and the eighth write operation.

Figure 28:
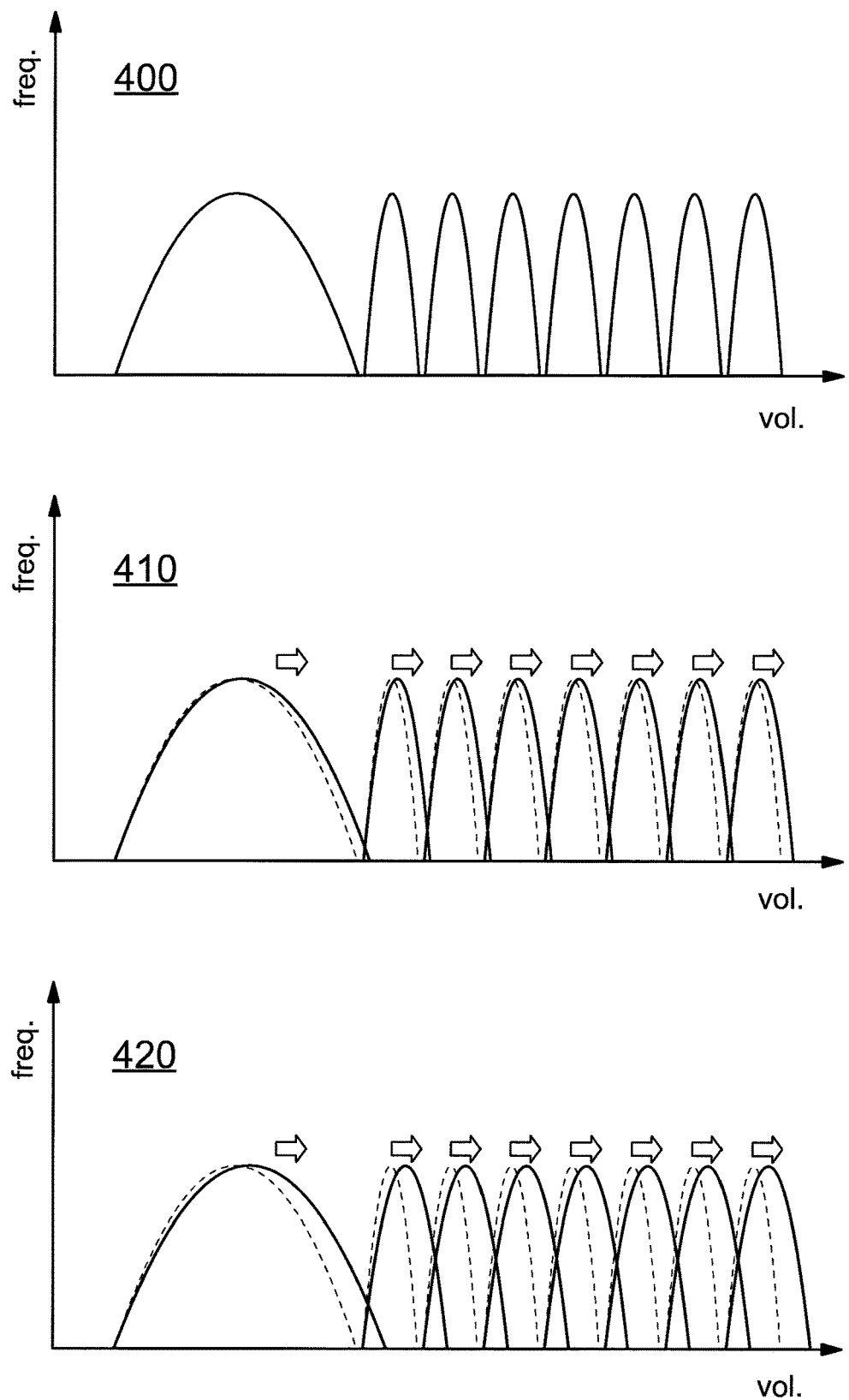
FIG. 28 is a diagram illustrating an influence that a threshold voltage distribution in a state where a write operation is completed receives by write operation to the memory cell transistor belonging to other pages, for memory cell transistor belonging to a certain page.

FIG. 28 is a diagram illustrating an influence that the threshold voltage distribution with respect to the memory cell transistor belonging to a certain page in the state where the write operation is completed receives by the write operation to the memory cell transistor belonging to other pages. FIG. 28 shows, with respect to a certain page, a threshold voltage distribution 400 immediately after completion of the write operation, a threshold voltage distribution 410 when the memory cell transistor receives two times of interferences by the write operation for the other memory cell transistors MT belonging to other pages, and a threshold voltage distribution 420 when the memory cell transistor receives three times of interferences by the write operation for the other memory cell transistors MT belonging to other pages. As described above, as the smaller the number of interferences received by the write operation to the other memory cell transistors MT belonging to other pages, it is possible to realize a threshold voltage distribution in which the width of the distribution of each level is narrow (the margin between levels is large). Therefore, the step-up width of the program voltage for each program operation in the write operation to the memory cell transistor MT on the word line WLo0 side can be set larger than the step-up width of the program voltage for each program operation in the write operation to the memory cell transistor MT on the word line WLo0 side.

Write Operation of Comparative Example

Referring to FIGS. 23 to 27, the write operation of the comparative example will be described. FIGS. 23 to 26 are diagrams illustrating the write operation referring to the layout of the word lines and memory pillars in the semiconductor storage device of the comparative example. The write operation shown in FIGS. 23 to 26 is similar to the write operation shown in FIGS. 14 to 17, except that the write operation is performed by selecting in the order of the select gate lines SGD0→SGD 1→SGD 2→SGD 3. That is, in the comparative example, the select gate line SGD is selected in the order in the opposite direction of the Y-direction.

Figure 23:
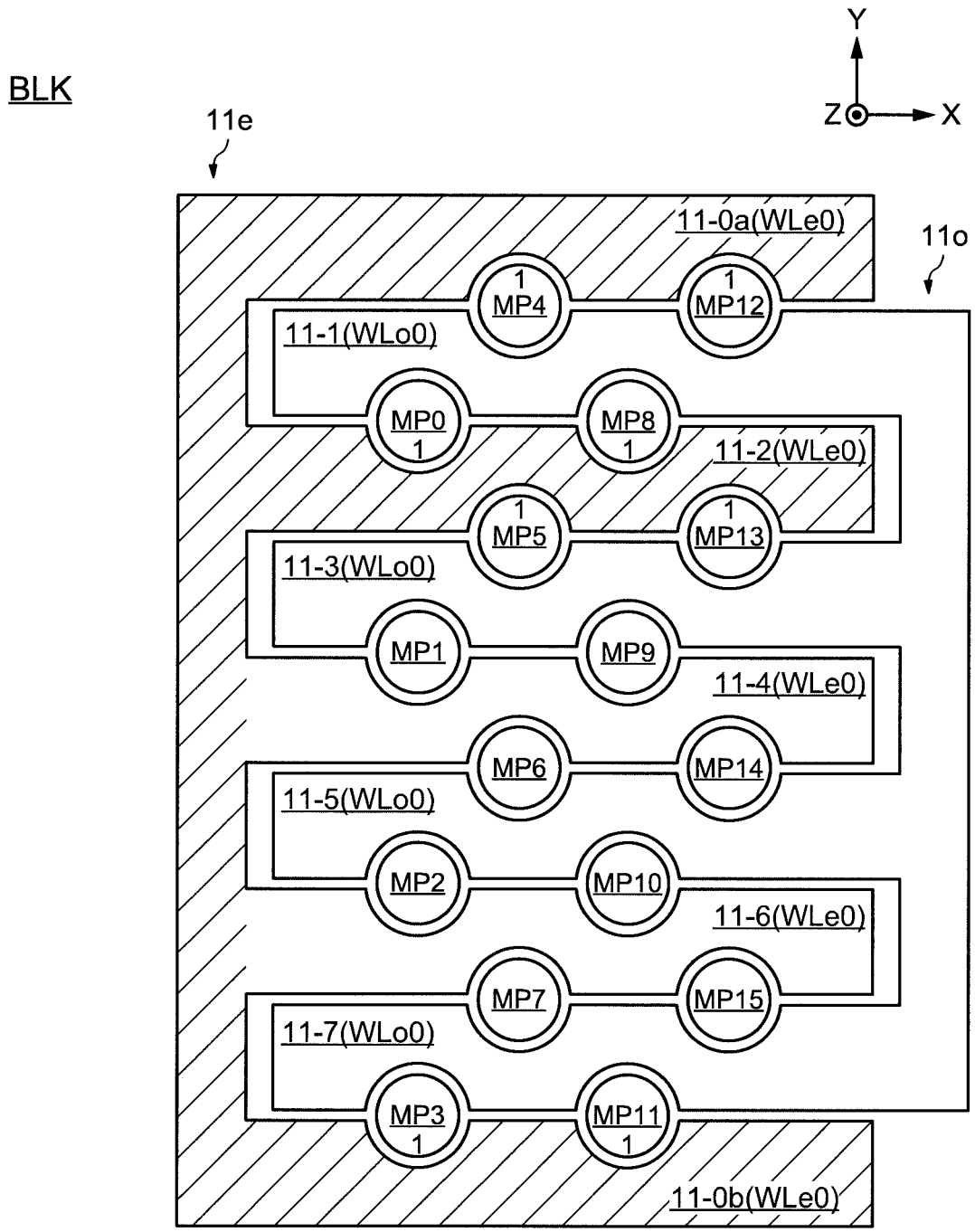
FIG. 23 is a diagram illustrating a write operation referring to a layout of word lines and memory pillars in a semiconductor storage device of a comparative example.

As shown in FIG. 23, when the select gate line SGD0 (see FIG. 5) is selected, the write operation is performed on the memory cell transistor MT provided on the word line WLe0 side of each of the memory pillars MP0, MP3, MP4, MP5, MP8, MP11, MP12, MP13. In FIG. 23, "1" is indicated at a position corresponding to the memory cell transistor MT to which data has been written by the write operation (the first write operation).

Figure 24:
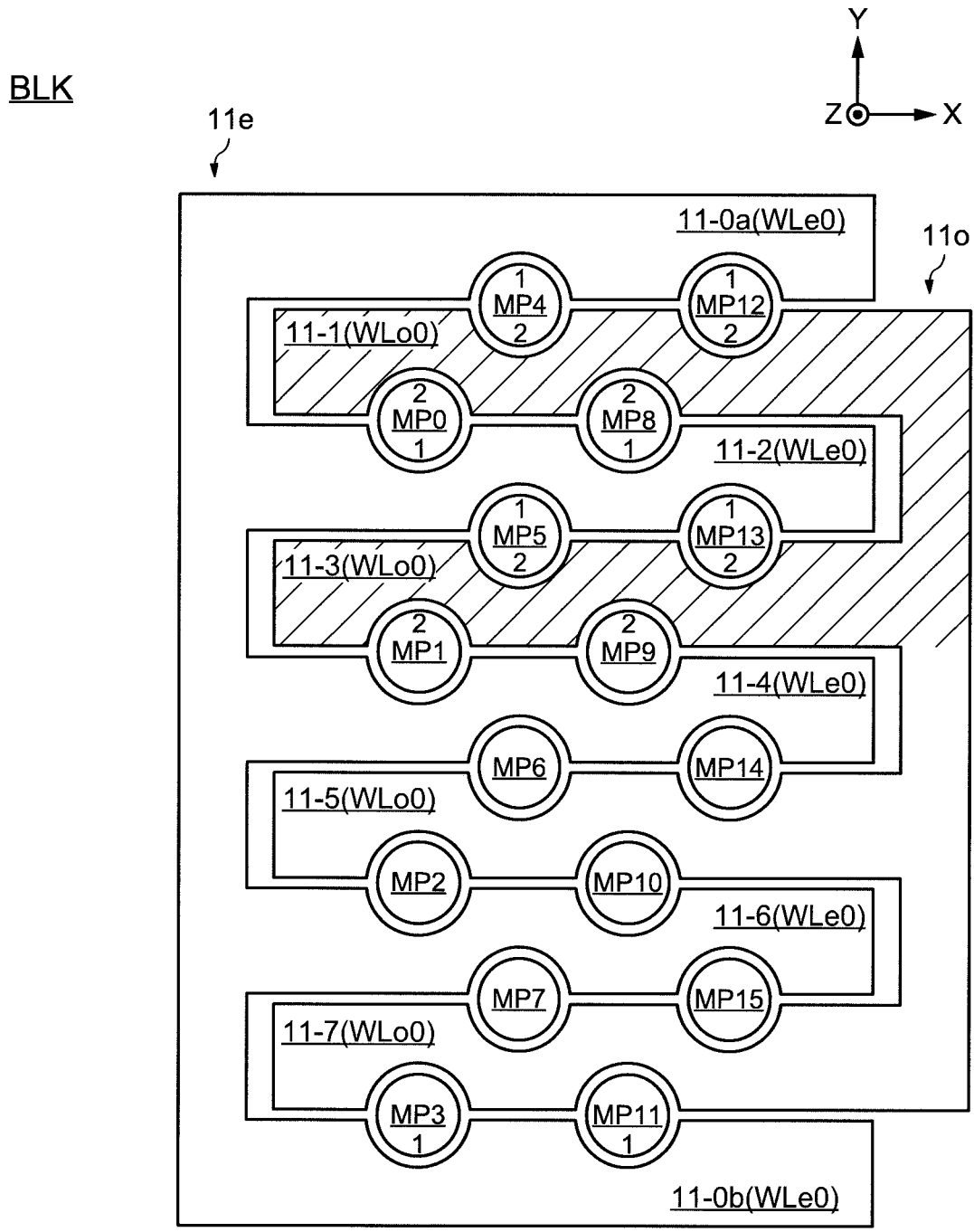
FIG. 24 is a diagram illustrating a write operation referring to a layout of word lines and memory pillars in a semiconductor storage device of a comparative example.

Next, as shown in FIG. 24, when the select gate line SGD1 (see FIG. 5) is selected, the write operation is performed on the memory cell transistor MT provided on the word line WLo0 side of each of the memory pillars MP0, MP1, MP4, MP5, MP8, MP9, MP12, MP13. In FIG. 24, "2" is indicated at a position corresponding to the memory cell transistor MT to which data has been written by the write operation (the second write operation).

Figure 25:
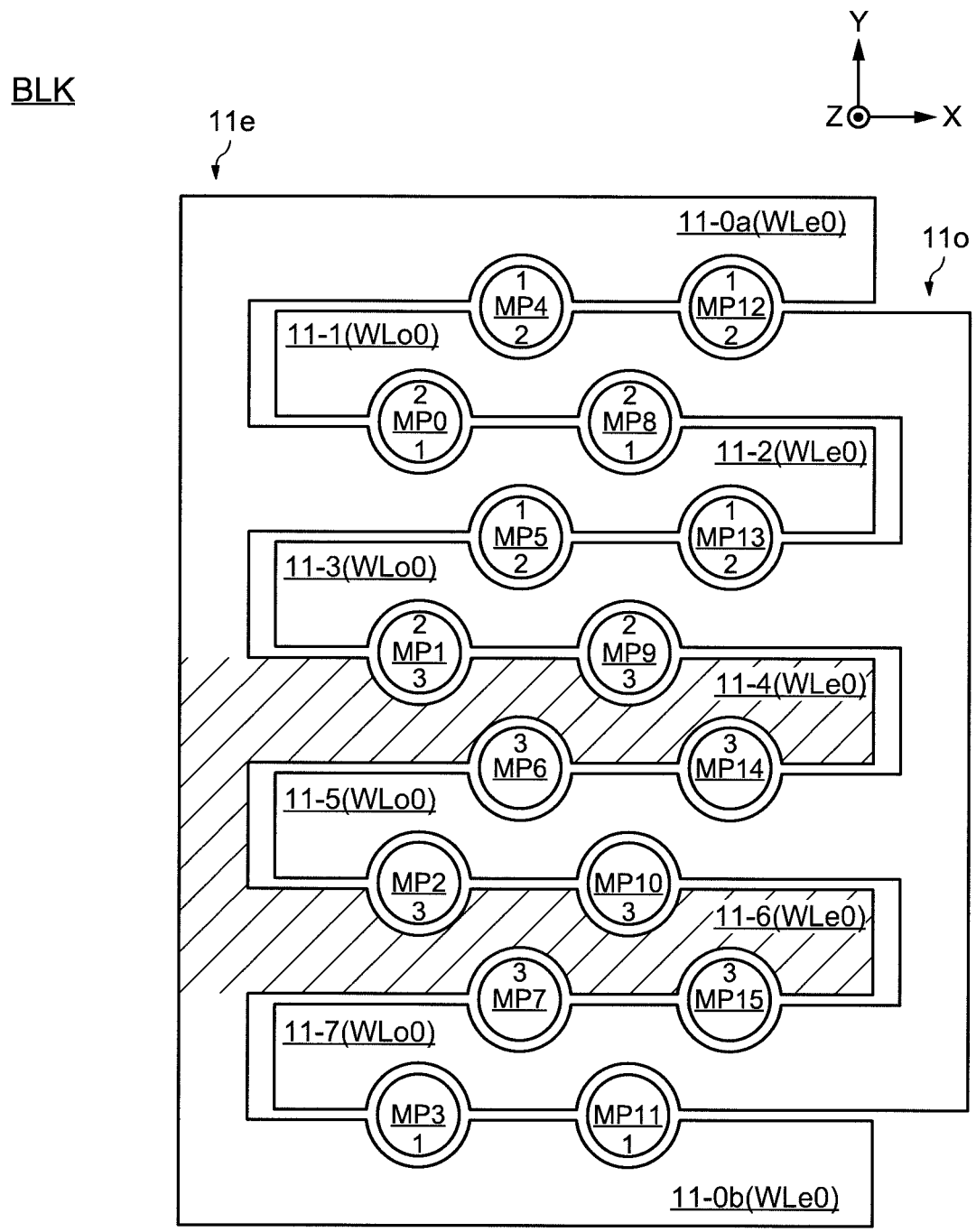
FIG. 25 is a diagram illustrating a write operation referring to a layout of word lines and memory pillars in a semiconductor storage device of a comparative example.

Next, as shown in FIG. 25, when the select gate line SGD2 (see FIG. 5) is selected, the write operation is performed on the memory cell transistor MT provided on the word line WLe0 side of each of the memory pillars MP1, MP2, MP6, MP7, MP9, MP10, MP14, MP15. In FIG. 25, "3" is indicated at a position corresponding to the memory cell transistor MT to which data has been written by the write operation (the third write operation).

Figure 26:
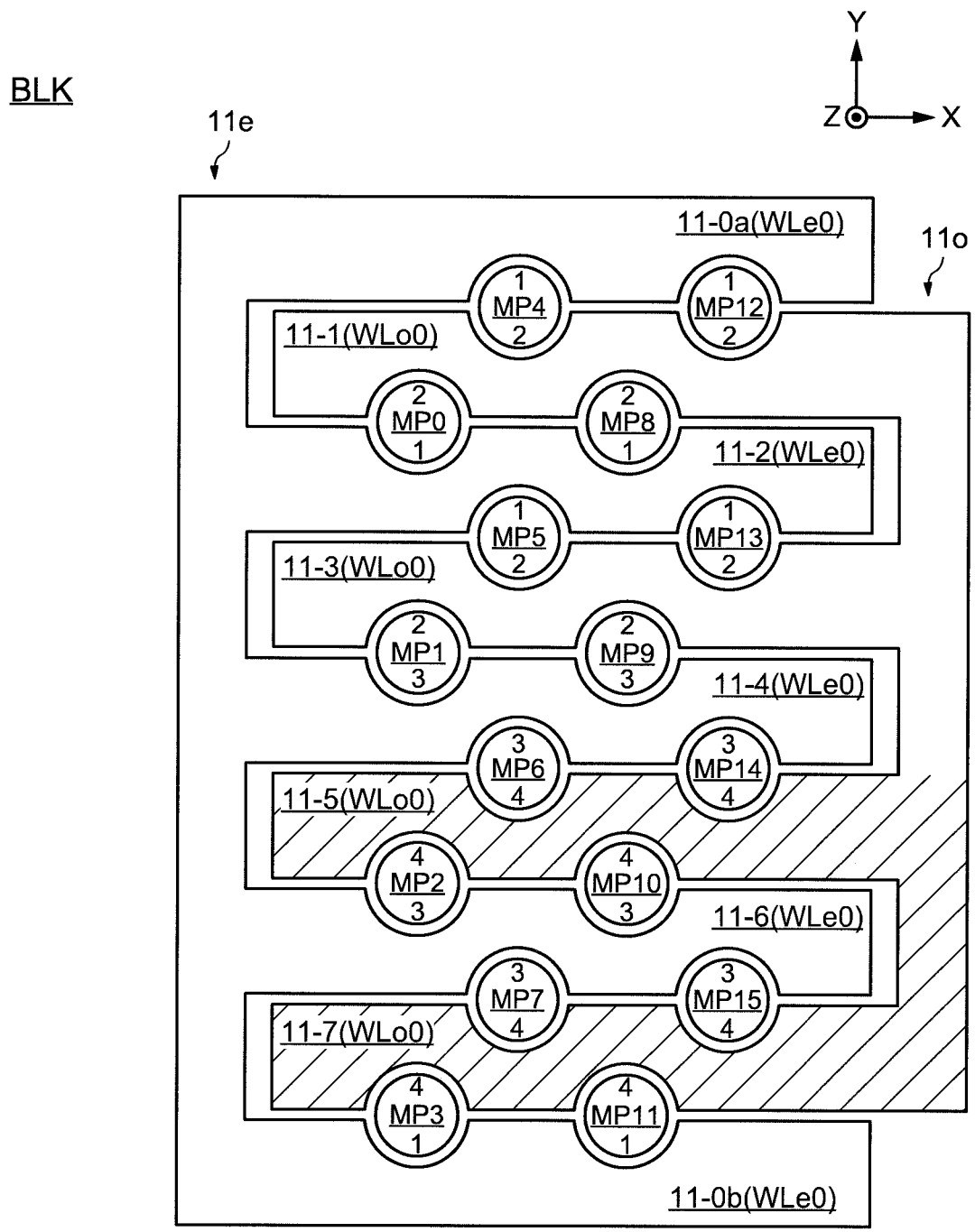
FIG. 26 is a diagram illustrating a write operation referring to a layout of word lines and memory pillars in a semiconductor storage device of a comparative example.

Next, as shown in FIG. 26, when the select gate line SGD3 (see FIG. 5) is selected, the write operation is performed on the memory cell transistor MT provided on the word line WLo0 side of each of the memory pillars MP2, MP3, MP6, MP7, MP10, MP11, MP14, MP15. In FIG. 26, "4" is indicated at a position corresponding to the memory cell transistor MT to which data has been written by the write operation (the fourth write operation).

[Interference Caused by Write Operation of Comparative Example]

Figure 27:
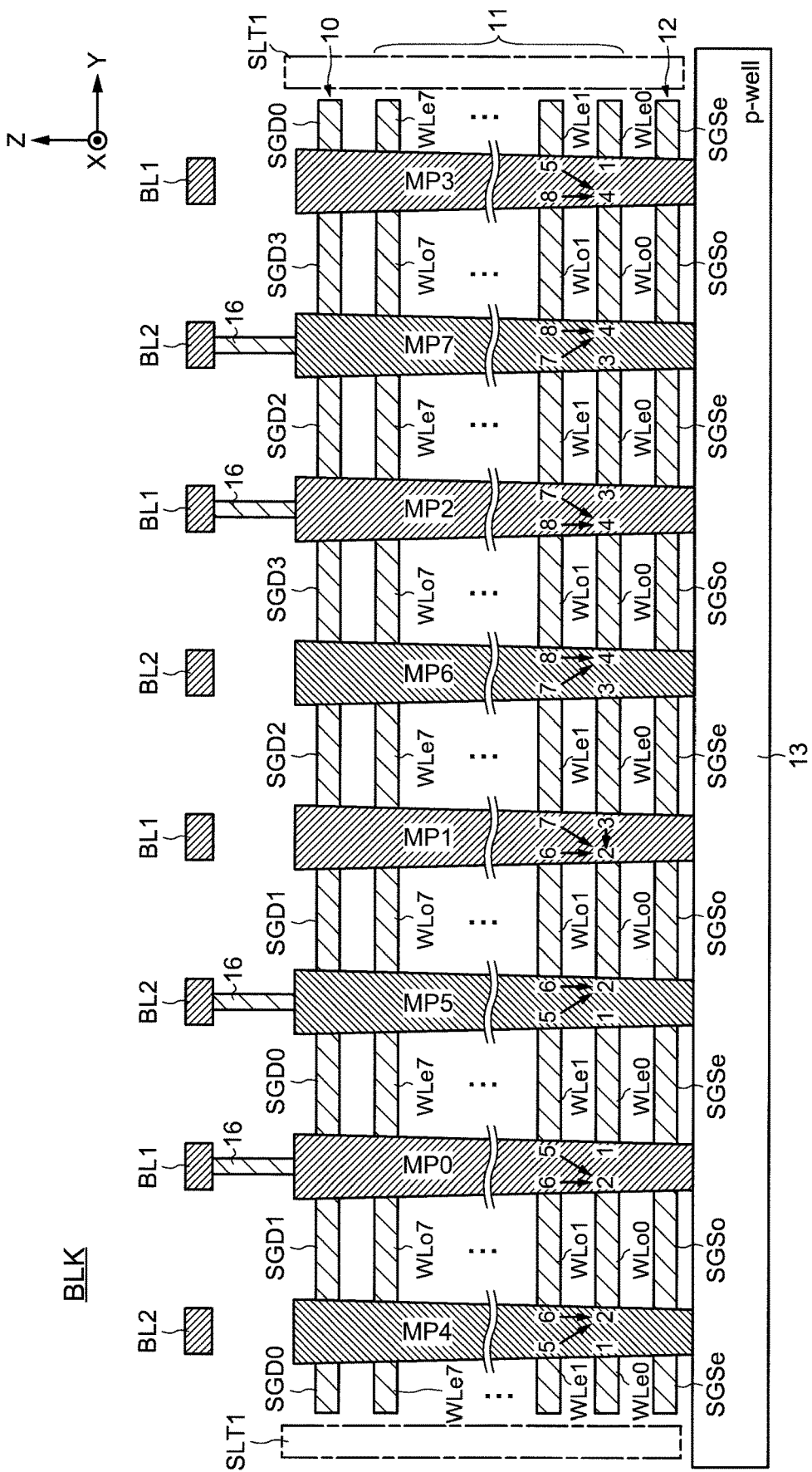
FIG. 27 is a diagram illustrating how a target memory cell receives interference caused by a write operation to another memory cell in a comparative example.

Referring to FIG. 27, an effect of Interference caused by the write operation of the comparative example will be described. In FIG. 27, the numbers (1 to 4) written on the word line WL side of each memory pillar MP correspond to the numbers written on each memory pillar MP in FIGS. 23 to 26 indicating the order of the write operation. Similar to the above, the numbers (5 to 8) shown in FIG. 27 are also numbers indicating the order of the write operation.

As shown in FIG. 27, in the comparative example, in the first write operation, writing to the memory cell transistor MT on word line WLe0 side is performed for each of the three memory pillars MP4, MP0, MP5 from the left and the rightmost memory pillar MP3. Next, in the second write operation, writing to the memory cell transistor MT on the word line WLo0 side is performed for each of the four memory pillars MP4, MP0, MP5, MP1 from the left. Next, in the third write operation, writing to the memory cell transistor MT on the word line WLe0 side is performed for each of the memory pillars MP1, MP6, MP2, MP7. Finally, in the fourth write operation, writing to the memory cell transistor MT on the word line WLo0 side is performed for each of the memory pillars MP6, MP2, MP7, MP3.

In the memory pillars MP4, MP0, MP5, the memory cell transistor MT, which is the target of the second write operation, receives only two times of interferences by the fifth write operation and the sixth write operation. However, in the memory pillar MP1, the memory cell transistor MT, which is the target of the second write operation, receives three times of interferences due to the third write operation, the sixth write operation, and the seventh write operation. That is, the memory cell transistor MT that receives three times of interferences and the memory cell transistor MT that receives only two times of interferences are mixed in the memory cell transistor MT on one page. As described above, even when only a part of the memory cell transistors MT on a certain page is affected by the interference due to the write operation to other subsequent pages, for all the memory cell transistors MT of the certain page, the width of the threshold voltage distribution at the time when the write operation is completed needs to be suppressed small. Therefore, in the second write operation, the step-up width needs to be set small so that the width of the threshold voltage distribution can be suppressed to be small in the memory cell transistors MT on the word line WLo0 side of the memory pillar MP1, which receives three times of interferences.

With respect to the above-described comparative example, in the present embodiment shown in FIGS. 14 to 18, the write operation is performed to two pages. One page is configured with the memory cell transistor MT that receives three times of interferences. Another page is configured with the memory cell transistor MT that receives only two times of interferences. Therefore, it is possible that the step-up width of the write operation to the page configured with the memory cell transistor MT receiving only two times of interferences is larger than the step-up width of the write operation to the page configured with the memory cell transistor MT receiving three times of interferences.

[Determination Method of First Memory Cell and Second Memory Cell]

Figure 19:
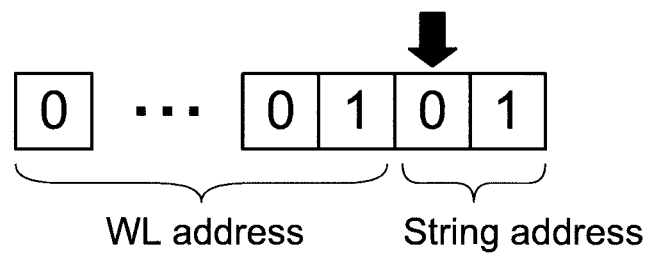
FIG. 19 is a diagram illustrating assignment of row addresses in a semiconductor storage device according to an embodiment.

The writing order in this embodiment is SGD0→SGD2→SGD1→SGD3. The assignment of address bits for facilitating such a write order is described. Since the number of strings in the block is four in this embodiment, the number of bits required as a string address is 2-bit as shown in FIG. 19. When "00" is assigned to SGD0, "01" is assigned to SGD2, "10" is assigned to SGD1, and "11" is assigned to SGD3, the write operation is executed naturally in the order shown in this embodiment by increasing the address by one. That is, when the most significant bit of the string address (the bit indicated by the arrow in FIG. 19) is "0", the address can be set so that NAND string 50e is specified, and when the most significant bit is "1", the address can be set so that the NAND string 50o is specified.

In the present embodiment, an example in which a 4-string memory array is included in one block is shown, but the embodiment is not limited to this example. For example, even if one block contains no less than five strings, the write operation can be executed naturally in the order shown in the present embodiment by specifying the NAND string 50e or 50o using the most significant bit as described above. For example, since the number of bits required for the string address is three in a memory array containing eight strings in one block, the NAND string 50e or 50o is distinguished using the most significant bit. Thus, by increasing the binary address by one, the write operation is executed naturally in the order of the present embodiment, and the control of the writing order in the memory controller can be facilitated.

[Program Voltage in Write Operation]

Figure 20:
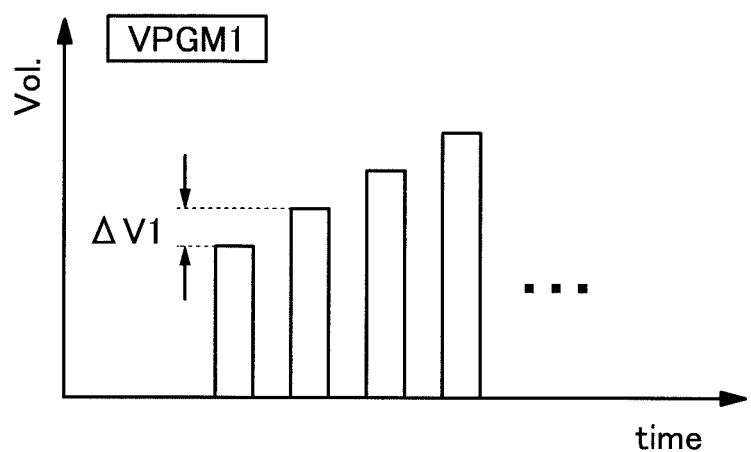
FIG. 20 is a diagram illustrating a program voltage in a write operation in a semiconductor storage device according to an embodiment.
Figure 20:
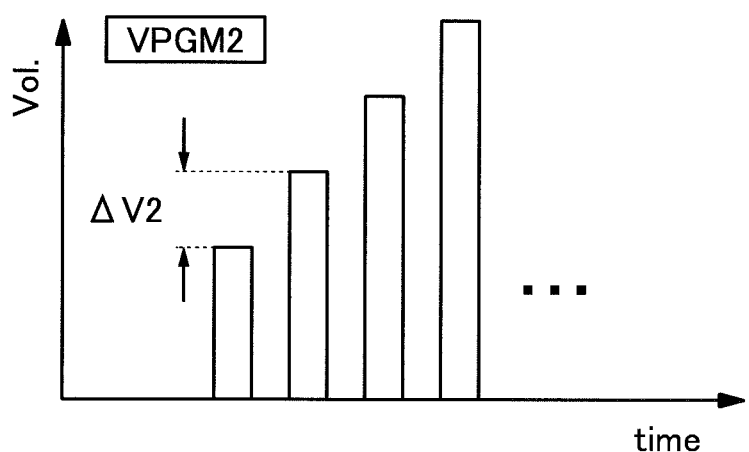

Referring to FIG. 20, the program voltage in the write operation of the present embodiment will be described. In FIG. 20, VPGM1 represents a program voltage for the memory cell transistor MT (the first memory cell) facing to the word line WLe, and VPGM2 represents a program voltage for the memory cell transistor MT (the second memory cell) facing to the word line WLo.

In general, the memory cell transistor MT belonging to a certain page has variations in characteristics. For example, among the memory cell transistors MT belonging to a certain page, while in a part of the memory cell transistors MT, the threshold voltage raises to the target level by applying a relatively low program voltage, whereas, in the other parts of the memory cell transistors MT, the threshold voltage may not be raised to the target level unless a relatively high program voltage is applied. Therefore, in the write operation, the program operation and the verify operation are performed alternatively. The program operation is an operation to raise the threshold voltage of the memory cell transistor MT that is the target of the write operation by applying the program voltage. The verify operation is an operation to check whether the threshold level has increased to the desired level by the program operation.

The program voltage is gradually stepped up by multiple times of program operation. Thus, even when there is a variation in the characteristics of the memory cell transistors MT belonging to a certain page, it is possible to converge those thresholds to a value close to the target level (a narrow threshold distribution can be realized).

In FIG. 20, $\Delta V1$ indicates the step-up width of the program voltage in the write operation to the first memory cell. $\Delta V2$ indicates the step-up width of the program voltage in the write operation to the second memory cell. When the step-up width of the program voltage is set relatively small, it is possible to converge the threshold of the memory cell transistor MT easily to a value close to the target level (a narrow threshold distribution can be realized), but the time until the write operation is completed is longer. On the other hand, when the step-up width of the program voltage is set relatively large, the time until the write operation is completed is shorter, but it becomes difficult to converge the threshold value of the memory cell transistor MT to a value close to the target level (the threshold distribution becomes broader).

As described above, the number of times that the memory cell transistor MT (the second memory cell) facing to the word line WLo receives the interference by the write operation to the memory cell transistors MT belonging to the other pages is smaller than the number of times that the memory cell transistor MT (the first memory cell) facing to the word line WLe receives the interference. Therefore, the width of each level in the threshold voltage distribution of the second memory cell after receiving the interference is smaller than the width of each level in the threshold voltage distribution of the first memory cell after receiving the interference. Therefore, as described above, even when the step-up width $\Delta V2$ of the program voltage in the write operation to the second memory cell is made larger than the step-up width $\Delta V1$ of the program voltage in the write operation to the first memory cell, the width of each level in the threshold voltage distribution can be made equal to each other. On the other hand, since $\Delta V2$ is larger than $\Delta V1$, the speed of the write operation to the second memory cell can be made faster than the speed of the write operation to the first memory cell. Consequently, while keeping the accuracy of the write operation to the first memory cell equal to the accuracy of the write operation to the second memory cell, the time of the write operation to the second memory cell can be shorter than the time of the write operation to the first memory cell.

Figure 21:
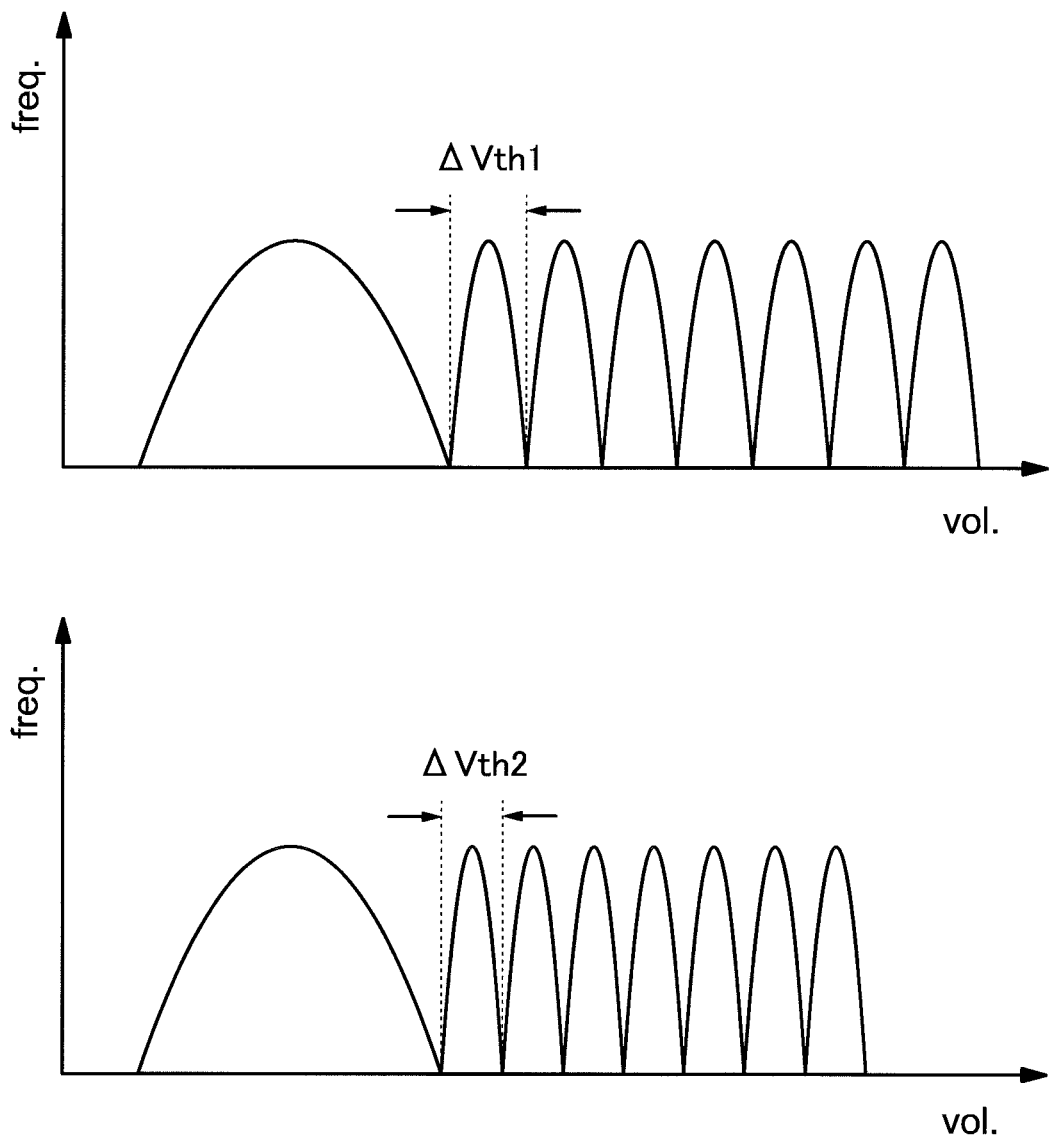
FIG. 21 is a diagram illustrating a width of a threshold voltage distribution in a semiconductor storage device according to an embodiment.

Referring to FIG. 21, the program voltage in the write operation according to the modification of the present embodiment will be described. In FIG. 21, $\Delta Vth1$ is the width of the threshold voltage distribution of Vth after the write operation to the memory cell transistor MT (the first memory cell) facing to the word line WLe and before being interfered. $\Delta Vth2$ is the width of the threshold voltage distribution of Vth after the write operation to the memory cell transistor MT (the second memory cell) facing to the word line WLo and before being interfered. As described above, the second memory cell receives less interference than the first memory cell. Therefore, when the write operation is executed with the same write voltage step-up width $\Delta V$, $\Delta Vth2$ can be made narrower than $\Delta Vth1$. Since $\Delta Vth2$ is narrower than $\Delta Vth1$, the voltage of each threshold distribution of the memory cell transistor MT facing to the word line WLo can be made smaller than the voltage of each threshold distribution of the memory cell transistor MT facing to the word line WLe. The larger the magnitude of the interference effect, the larger the amount of change in the threshold voltage. In this embodiment, since the amount of change in the threshold voltage of the memory cell transistor MT facing to the word line WLo is relatively small, it is possible to reduce the interference effect from the memory cell transistor MT facing to the word line WLo to the memory cell transistor MT facing to the word line WLe. Since the interference effect is reduced, $\Delta V1$ can be increased, and as a result, the writing time is faster.

As described above, in the present embodiment, since the time of the write operation to the second memory cell can be shorter than the time of the write operation to the first memory cell, the time of the entire write operation can be shortened.

Second Embodiment

Referring to FIG. 22, a memory system according to the second embodiment will be described. The write operation of the memory system according to the second embodiment is different from the write operation of the memory system according to the first embodiment. In the other respects, the second embodiment has the same configuration as that of the first embodiment, and therefore description thereof is omitted.

[Write Operation of Multiple Stages]

Referring to FIG. 22, a write operation of multiple stages is described. In the example of FIG. 22, an example in which the write operation is performed separately in two stages (first stage and second stage) for one page will be described. In the write operation of multiple stages according to the present embodiment, firstly, the write operation of the first stage is performed on the target page. After the write operation of the first stage, the write operation of the first stage is performed on a page corresponding to the other word lines WL. Thereafter, the write operation of the second stage is performed on the target page. In the write operation of the first stage, the number of program operations and verify operations are relatively small, and the step-up width of the program voltage used in the program operation is relatively large. Thus, the threshold voltage distribution is formed roughly. On the other hand, in the write operation of the second stage, the number of program operations and verify operations are relatively large, and the step-up width of the program voltage used in the program operation is relatively small. Thus, the threshold voltage distribution is densely formed. In FIG. 22, the numbers in the frames below the items of SGD0 to 3 indicate the order of executing the write operation.

The write operation at each stage is performed in the order of the select gate line SGD0→SGD2→SGD1→SGD3 for each word line, as in the above-described embodiments (FIGS. 14 to 18). As shown in FIG. 22, after the write voltage of the first stage for the word line WL0 is supplied, the write voltage of the first stage for the word line WL1 is supplied. Thereafter, the write voltage of the second stage for the word line WL0 is supplied, and then the write voltage of the first stage for the word line WL2.

The word line WLe0 may be referred to as a "first word line". The word line WLo0 may be referred to as a "second word line". The word line WLe1 may be referred to as a "third word line". The word line WLo1 may be referred to as a "fourth word line". As shown in FIG. 7, in the Z-direction, the word line WLe0 (the first word line) and the word line WLo0 (the second word line) are provided in a layer adjacent to the word line WLe1 (the third word line) and the word line WLo1 (the fourth word line) in the Z-direction. Referring to FIG. 6, each of the plurality of memory pillars MP0 to MP15 is sandwiched between the word line WLe0 (the first word line) and the word line WLo0 (the second word line), and similarly sandwiched between the word line WLe1 (the third word line) and the word line WLo1 (the fourth word line).

The memory cell transistor facing to the word line WLe0 (the first word line) may be referred to as a "first memory cell". The memory cell transistor facing to the word line WLo0 (the second word line) may be referred to as a "second memory cell". The memory cell transistor facing to the word line WLe1 (the third word line) may be referred to as a "third memory cell". The memory cell transistor facing to the word line WLo1 (the fourth word line) may be referred to as a "fourth memory cell". The first memory cell and the third memory cell share the same memory pillar MP (e.g., MP0). That is, in FIGS. 14 to 17, when the memory cell transistor MT provided in the memory pillar MP0 facing to the word line WLe0 is referred to as the first memory cell, the third memory cell corresponds to the memory cell transistor MT provided in the memory pillar MP0 facing to the word line WLe1 provided on the upper layer of the word line WLe0. Similarly, when the memory cell transistor MT provided in the memory pillar MP0 facing to the word line WLo0 is referred to as the second memory cell, the fourth memory cell corresponds to the memory cell transistor MT provided in the memory pillar MP0 facing to the word line WLo1 provided on the upper layer of the word line WLo0.

As shown in FIG. 22, in each of the first memory cell facing to the word line WLe0, the second memory cell facing to the word line WLo0, the third memory cell facing to the word line WLe1, and the fourth memory cell facing to the word line WLo1, the write operation is performed in the order of the write operation of the first stage (the first write operation), the write operation of the second stage (the second write operation).

After the first write operation to the first memory cell ("1" and "2" in FIG. 22) and the first write operation to the second memory cell ("3" and "4" in FIG. 22), the first write operation to the third memory cell ("5" and "6" in FIG. 22) and the first write operation to the fourth memory cell ("7" and "8" in FIG. 22) are performed. Next, the second write operation to the first memory cell ("9" and "10" in FIG. 22) and the second write operation to the second memory cell ("11" and "12" in FIG. 22) are performed. Thereafter, the first write operation to the memory cell transistor MT facing to the word line WLe2 ("13" and "14" in FIG. 22) and the first write operation to the memory cell transistor MT facing to the word line WLo2 ("15" and "16" in FIG. 22) are performed.

Also, in the modification of the present embodiment, since the time of the write operation to the second memory cell can be shorter than the time of the write operation to the first memory cell, the time of the entire write operation can be shortened.

While the present invention has been described with reference to the accompanying drawings, the present invention is not limited to the above embodiments and can be appropriately modified without departing from the spirit of the present invention. For example, adding, deleting or changing designs of components as appropriate based on the compression/decompression circuit of the present embodiment by one skilled in the art is also included in the scope of the present invention as long as the gist of the present invention is provided. Furthermore, the embodiments described above can be appropriately combined as long as there is no mutual inconsistency, and technical matters common to the embodiments are included in the embodiments even if they are not explicitly described.

Even if it is other working effects which is different from the working effect brought about by the mode of each above-mentioned embodiment, what is clear from the description in this description, or what can be easily predicted by the person skilled in the art is naturally understood to be brought about by the present invention.

What is claimed is:
1. A semiconductor storage device comprising:
a substrate having a surface extending in a first direction and a second direction crossing the first direction,
first to fourth memory pillars each extending in a third direction crossing the first direction and the second direction;
a first word line provided in a first layer, extending in the first direction and facing one sides of the first to fourth memory pillars in the second direction;
a second word line provided in the first layer, extending in the first direction and facing the other sides of the first to fourth memory pillars in the second direction;
a third word line provided in a second layer above the first layer in the third direction, extending in the first direction and facing the one sides of the first to fourth memory pillars in the second direction;
a fourth word line provided in the second layer, extending in the first direction and facing the other sides of the first to fourth memory pillars in the second direction;
a first select gate provided in a third layer above the second layer in the third direction, extending in the first direction and facing the other sides of the first and fourth memory pillars in the second direction;
a second select gate provided in the third layer in the third direction, extending in the first direction and facing the one sides of the first and second memory pillars in the second direction;
a third select gate provided in the third layer in the third direction, extending in the first direction and facing the other sides of the second and third memory pillars in the second direction;
a fourth select gate provided in the third layer in the third direction, extending in the first direction and facing the one sides of the third and fourth memory pillars in the second direction;
a control circuit,
wherein
memory cells are formed at intersections of the first to fourth word lines and the first to fourth memory pillars, respectively,
the control circuit is configured to:
perform a first write operation to the memory cells formed at the intersections of the first word line and the first and fourth memory pillars;
after the first write operation, perform a second write operation to the memory cells formed at the intersections of the first word line and the second and third memory pillars;
after the second write operation, perform a third write operation to the memory cells formed at the intersections of the second word line and the first and second memory pillars;

after the third write operation, perform a fourth write operation to the memory cells formed at the intersections of the second word line and the third and fourth memory pillars.

2. The semiconductor storage device according to claim 1, wherein
each of the first to fourth memory pillars includes a first memory cell facing to the first word line and a second memory cell facing to the second word line,
the first word line has
a plurality of first memory cell sections having a longitudinal in the first direction and arranged in the second direction, and
a first connecting section connecting the first memory cell sections arranged in the second direction,
the second word line has
a plurality of second memory cell sections having a longitudinal in the first direction and arranged in the second direction, and
a second connecting section connecting the second memory cell sections arranged in the second direction, and
each of the first through fourth memory pillars is arranged between the first memory cell section and the second memory cell section adjacent to the first memory cell section.

3. The semiconductor storage device according to claim 1, wherein
each of the first to fourth memory pillars includes a first memory cell facing to the first word line and a second memory cell facing to the second word line, and
the first memory cell and the second memory cell are decided by the most significant bit in each of string addresses.

4. The semiconductor storage device according to claim 1, wherein
each of the first to fourth memory pillars includes a first memory cell facing to the first word line and a second memory cell facing to the second word line, and
a step-up width of a program voltage in a write operation to the first memory cell is smaller than a step-up width of a program voltage in a write operation to the second memory cell.

5. The semiconductor storage device according to claim 1, wherein
each of the first to fourth memory pillars includes a first memory cell facing to the first word line and a second memory cell facing to the second word line, and
a width of a threshold voltage distribution in the second memory cell is smaller than a width of a threshold voltage distribution in the first memory cell.

6. The semiconductor storage device according to claim 1, wherein
each of the first to fourth memory pillars is sandwiched by the third word line and the fourth word line, and includes a third memory cell and a fourth memory cell, the third memory cell facing to the third word line and sharing the memory pillar with the first memory cell, the fourth memory cell facing to the fourth word line and sharing the memory pillar with the second memory cell,
the control circuit is
configured to perform in order of a first write operation and a second write operation in each of the first memory cell, the second memory cell, the third memory cell, and the fourth memory cell,
configured to perform the first write operation to the third memory cell and the fourth memory cell after performing the first write operation to the first memory cell and the second memory cell, and
configured to perform the second write operation to the first memory cell and the second memory cell after performing the first write operation to the third memory cell and the fourth memory cell.

7. The semiconductor storage device according to claim 1, wherein
each of the first to fourth memory pillars includes a first memory cell facing to the first word line and a second memory cell facing to the second word line, and
the first memory cell has a first semiconductor layer and a first charge storage layer between the first word line and the first semiconductor layer, and
the second memory cell has a second semiconductor layer and a second charge storage layer between the second word line and the second semiconductor layer.

8. The semiconductor storage device according to claim 7, wherein
each of the first to fourth memory pillars has
a longitudinal in the third direction, and
an insulation layer having a longitudinal in the third direction, and
the first semiconductor layer is provided around the insulation layer continuously.

9. The semiconductor storage device according to claim 8, wherein
each of the first to fourth memory pillars includes a first memory cell facing to the first word line and a second memory cell facing to the second word line, and
the first memory cell has a first channel,
the second memory cell has a second channel, and
the first channel and the second channel partially overlap.

10. The semiconductor storage device according to claim 9, wherein
each of the first to fourth memory pillars includes a first memory cell facing to the first word line and a second memory cell facing to the second word line, and
the first memory cell has a first source and a first drain,
the second memory cell has a second source and a second drain,
the first source and the second source are electrically connected, and
the first drain and the second drain are electrically connected.

11. The semiconductor storage device according to claim 1, wherein
the control circuit is further configured to:
after the fourth write operation, perform a fifth write operation to the memory cells formed at the intersections of the third word line and the first and fourth memory pillars;
after the fifth write operation, perform a sixth write operation to the memory cells formed at the intersections of the third word line and the second and third memory pillars;
after the sixth write operation, perform a seventh write operation to the memory cells formed at the intersections of the fourth word line and the first and second memory pillars;
after the seventh write operation, perform an eighth write operation to the memory cells formed at the intersections of the fourth word line and the third and fourth memory pillars;

after the eighth write operation, perform a ninth write operation to the memory cells formed at the intersections of the first word line and the first and fourth memory pillars;

after the ninth write operation, perform a tenth write operation to the memory cells formed at the intersections of the first word line and the second and third memory pillars;

after the tenth write operation, perform an eleventh write operation to the memory cells formed at the intersections of the second word line and the first and second memory pillars; and after the eleventh write operation, perform a twelfth write operation to the memory cells formed at the intersections of the second word line and the third and fourth memory pillars.

\* \* \* \* \*